(12) United States Patent
Benoit et al.

(10) Patent No.: US 7,399,806 B2
(45) Date of Patent: Jul. 15, 2008

(54) SYNTHESIS OF PHOTORESIST POLYMERS

(75) Inventors: Didier Benoit, San Jose, CA (US);
Adam Safir, Berkeley, CA (US);
Han-Ting Chang, Livermore, CA (US);
Dominique Charmot, Campbell, CA (US); Kenji Okamoto, Yokkaichi (JP);
Isao Nishimura, Yokkaichi (JP); Yong Wang, Yokkaichi (JP)

(73) Assignee: Symyx Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/734,474

(22) Filed: Apr. 12, 2007

(65) Prior Publication Data

US 2007/0185276 A1 Aug. 9, 2007

Related U.S. Application Data

(63) Continuation of application No. 10/877,110, filed on Jun. 25, 2004, now Pat. No. 7,250,475.

(60) Provisional application No. 60/483,190, filed on Jun. 26, 2003.

(51) Int. Cl.
*C08F 2/38* (2006.01)
*C08F 4/04* (2006.01)

(52) U.S. Cl. .................. 525/259; 525/261; 525/263; 525/220; 525/222; 525/230; 526/222; 526/281

(58) Field of Classification Search ................ 525/259, 525/261, 263, 220, 222, 230; 526/222, 281
See application file for complete search history.

(56) References Cited

U.S. PATENT DOCUMENTS

| | | |
|---|---|---|
| 3,697,643 A | 10/1972 | Shepherd et al. |
| 3,914,405 A | 10/1975 | Shepherd et al. |
| 3,954,682 A | 5/1976 | Fein et al. |
| 4,001,393 A | 1/1977 | L'Orange |
| 4,342,857 A | 8/1982 | Gaffar |
| 4,427,652 A | 1/1984 | Gaffar |
| 4,461,884 A | 7/1984 | Peiffer et al. |
| 4,615,697 A | 10/1986 | Robinson |
| 4,693,887 A | 9/1987 | Shah |
| 4,705,695 A | 11/1987 | Lehmann et al. |
| 4,716,120 A | 12/1987 | Tsay et al. |
| 4,795,436 A | 1/1989 | Robinson |
| 4,801,460 A | 1/1989 | Goetz et al. |
| 4,840,787 A | 6/1989 | Grollier |
| 4,842,847 A | 6/1989 | Amjad |
| 4,871,786 A | 10/1989 | Aasen et al. |
| 4,877,603 A | 10/1989 | Degenhardt et al. |
| 4,892,724 A | 1/1990 | Amjad |
| 4,892,725 A | 1/1990 | Amjad |
| 4,963,356 A | 10/1990 | Calenoff et al. |
| 4,983,392 A | 1/1991 | Robinson |
| 5,068,278 A | 11/1991 | Peiffer et al. |
| 5,073,379 A | 12/1991 | Klimesch et al. |
| 5,102,666 A | 4/1992 | Acharya |
| 5,110,605 A | 5/1992 | Acharya |
| 5,194,246 A | 3/1993 | Vincent et al. |
| 5,208,009 A | 5/1993 | Gaffar et al. |
| 5,225,196 A | 7/1993 | Robinson |
| 5,264,513 A | 11/1993 | Ikemura et al. |
| 5,304,585 A | 4/1994 | Bunker |
| 5,314,962 A | 5/1994 | Otsu et al. |
| 5,336,486 A | 8/1994 | Acharaya |
| 5,415,864 A | 5/1995 | Kopecek et al. |
| 5,478,881 A | 12/1995 | Wilkerson, III et al. |
| 5,489,654 A | 2/1996 | Clouet |
| 5,580,578 A | 12/1996 | Oshlack et al. |
| 5,607,663 A | 3/1997 | Rozzi et al. |
| 5,614,586 A | 3/1997 | Tang et al. |
| 5,639,476 A | 6/1997 | Oshlack et al. |
| 5,658,986 A | 8/1997 | Clouet |
| 5,662,887 A | 9/1997 | Rozzi et al. |
| 5,686,094 A | 11/1997 | Acharaya |
| 5,750,733 A | 5/1998 | Vermeer et al. |
| 5,800,803 A | 9/1998 | Mirajkar et al. |
| 5,866,047 A | 2/1999 | Nagino et al. |
| 5,866,630 A | 2/1999 | Mitra et al. |

(Continued)

FOREIGN PATENT DOCUMENTS

DE 200 18 140 U1 3/2001

(Continued)

OTHER PUBLICATIONS

Otsu et al., "Controlled Synthesis of Polymer Using the Addition of Iniferter Technique: Developments in Living Radical Polymerization", *Advances in Polymer Science*, vol. 136, 1998, pp. 75-137.

(Continued)

*Primary Examiner*—Robert D. Harlan
(74) *Attorney, Agent, or Firm*—Dorsey & Whitney LLP; Scott D. Rothenberger

(57) ABSTRACT

The present invention is directed to the preparation of photoresist polymers via living free radical polymerization techniques. Sterically bulky ester monomers are utilized as the polymerization components. Use of chain transfer agents is included in polymerization processing conditions. Cleavage of polymer terminal end groups that include a heteroatom are described.

24 Claims, No Drawings

U.S. PATENT DOCUMENTS

| | | | |
|---|---|---|---|
| 5,888,491 A | 3/1999 | Mitra et al. |
| 5,904,735 A | 5/1999 | Guiterrez |
| 5,929,271 A | 7/1999 | Hada et al. |
| 5,962,184 A | 10/1999 | Allen et al. |
| 6,013,416 A | 1/2000 | Nozaki et al. |
| 6,048,666 A | 4/2000 | Niwa et al. |
| 6,087,063 A | 7/2000 | Hada et al. |
| 6,114,408 A | 9/2000 | Dickens |
| 6,126,922 A | 10/2000 | Rozzi et al. |
| 6,139,966 A | 10/2000 | Carlson et al. |
| 6,140,010 A | 10/2000 | Iwasa et al. |
| 6,140,431 A | 10/2000 | Kinker et al. |
| 6,153,705 A | 11/2000 | Corpart et al. |
| 6,190,833 B1 | 2/2001 | Shiota et al. |
| 6,206,959 B1 | 3/2001 | Dickens |
| 6,207,342 B1 | 3/2001 | Takechi et al. |
| 6,210,759 B1 | 4/2001 | Dickens |
| 6,214,320 B1 | 4/2001 | Gaffar et al. |
| 6,214,326 B1 | 4/2001 | Dupuis |
| 6,271,327 B1 | 8/2001 | Neissner et al. |
| 6,280,748 B1 | 8/2001 | Morita et al. |
| 6,280,911 B1 | 8/2001 | Trefonas, III |
| 6,303,266 B1 | 10/2001 | Okino et al. |
| 6,303,268 B1 | 10/2001 | Namba et al. |
| 6,312,668 B2 | 11/2001 | Mitra et al. |
| 6,315,987 B1 | 11/2001 | Plochocka |
| 6,380,335 B1 | 4/2002 | Charmot et al. |
| 6,391,286 B1 | 5/2002 | Mitra et al. |
| 6,391,529 B2 | 5/2002 | Maeda et al. |
| 6,395,850 B1 | 5/2002 | Charmot et al. |
| 6,423,463 B1 | 7/2002 | Oota et al. |
| 6,440,636 B1 | 8/2002 | Ushirogouchi |
| 6,444,747 B1 | 9/2002 | Chen et al. |
| 6,464,961 B2 | 10/2002 | Plochocka |
| 6,465,150 B1 | 10/2002 | Numata et al. |
| 6,468,712 B1 | 10/2002 | Fedynyshyn |
| 6,479,210 B2 | 11/2002 | Kinoshita et al. |
| 6,482,402 B1 | 11/2002 | Kurtz et al. |
| 6,492,086 B1 | 12/2002 | Barclay et al. |
| 6,512,021 B1 | 1/2003 | Sugiki et al. |
| 6,512,081 B1 | 1/2003 | Rizzardo et al. |
| 6,517,826 B1 | 2/2003 | Kurtz et al. |
| 6,517,827 B1 | 2/2003 | Kurtz et al. |
| 6,517,990 B1 | 2/2003 | Choi et al. |
| 6,517,991 B1 | 2/2003 | Kodama et al. |
| 6,517,993 B2 | 2/2003 | Nakamura et al. |
| 6,517,994 B2 | 2/2003 | Watanabe |
| 6,518,364 B2 | 2/2003 | Charmot et al. |
| 6,544,715 B2 | 4/2003 | Sato et al. |
| 6,548,221 B2 | 4/2003 | Uetani et al. |
| 6,558,654 B2 | 5/2003 | McLaughlin |
| 6,559,337 B2 | 5/2003 | Maeda et al. |
| 6,562,324 B1 | 5/2003 | Kumar et al. |
| 6,562,363 B1 | 5/2003 | Mantelle et al. |
| 6,569,971 B2 | 5/2003 | Roh et al. |
| 6,596,458 B1 | 7/2003 | Sato et al. |
| 6,787,282 B2 | 9/2004 | Sato |
| 6,919,409 B2 | 7/2005 | Charmot et al. |
| 6,994,827 B2 | 2/2006 | Safir et al. |
| 7,012,119 B2 | 3/2006 | Charmot et al. |
| 7,022,750 B2 | 4/2006 | Camp et al. |
| 2001/0012509 A1 | 8/2001 | Mitra et al. |
| 2001/0044070 A1 | 11/2001 | Uetani et al. |
| 2001/0046476 A1 | 11/2001 | Plochocka |
| 2002/0009420 A1 | 1/2002 | McLaughlin |
| 2002/0131944 A1 | 9/2002 | Glenn, Jr. et al. |
| 2002/0131945 A1 | 9/2002 | Glenn, Jr. et al. |
| 2002/0155080 A1 | 10/2002 | Glenn, Jr. et al. |
| 2002/0198284 A1 | 12/2002 | Nakatsuka et al. |
| 2003/0031643 A1 | 2/2003 | L'alloret et al. |
| 2003/0050359 A1 | 3/2003 | Kimura et al. |
| 2003/0073805 A1 | 4/2003 | Davis et al. |
| 2003/0118635 A1 | 6/2003 | Dalsgaard et al. |
| 2003/0124065 A1 | 7/2003 | Majeti et al. |
| 2003/0138397 A1 | 7/2003 | Kurtz et al. |
| 2003/0170592 A1 | 9/2003 | Chadwick et al. |
| 2003/0180662 A1 | 9/2003 | Nakano |
| 2003/0232938 A1 | 12/2003 | Charmot et al. |
| 2005/0063918 A1 | 3/2005 | Charmot et al. |
| 2005/0063919 A1 | 3/2005 | Chang et al. |
| 2005/0063920 A1 | 3/2005 | Chang et al. |
| 2005/0063921 A1 | 3/2005 | Charmot et al. |

FOREIGN PATENT DOCUMENTS

| | | |
|---|---|---|
| EP | 0 349 232 | 1/1990 |
| EP | 0 421 149 | 4/1991 |
| EP | 0 449 619 | 10/1991 |
| EP | 1 182 506 | 2/2002 |
| JP | 2-27660 | 1/1990 |
| JP | 3-42618 | 2/1991 |
| JP | 4-226461 | 8/1992 |
| JP | 5-188598 | 7/1993 |
| JP | 7-221235 | 8/1995 |
| JP | 7-234511 | 9/1995 |
| JP | 2002-296783 | 10/2002 |
| JP | 2001-274195 | 3/2003 |
| JP | 2003-084436 | 3/2003 |
| WO | WO 98/01478 | 1/1998 |
| WO | WO 98/58974 | 12/1998 |
| WO | WO 99/05099 | 2/1999 |
| WO | WO 99/31144 | 6/1999 |
| WO | WO 99/35171 | 7/1999 |
| WO | WO 99/35177 | 7/1999 |
| WO | WO 99/51980 | 10/1999 |
| WO | WO 00/75207 | 12/2000 |
| WO | WO 01/76549 A2 | 10/2001 |
| WO | WO 01/85099 A2 | 11/2001 |
| WO | WO 01/95034 A1 | 12/2001 |
| WO | WO 02/090397 | 11/2002 |
| WO | WO 02/090409 A2 | 11/2002 |
| WO | WO 02/090424 | 11/2002 |
| WO | WO 2005/000924 A1 | 1/2005 |
| WO | WO 2005/003198 | 1/2005 |

OTHER PUBLICATIONS

Castro et al., "Kinetics and Mechanism of the Addition of Amines to Carbon Disulfide in Ethanol", *J. Org. Chem.*, vol. 49, 1984, pp. 863-866.

Corkan et al., "Experiment Manager Software for an Automated Chemistry Workstation, Including a Scheduler for Parallel Experimentation", *Chemometrics and Intelligent Lab. Sys.*, vol. 17, 1992, pp. 47-74.

Thayer, "Bioinformatics for the Masses", *Business*, vol. 78(6), 2000, pp. 19-32.

McFarland, "Approaches For Rapid Materials Discovery Using Combinatorial Methods", Matrice Technologies, Ltd., vol. 13.3, 1998, pp. 107-120.

Cargill et al., "Automated Combinatorial Chemistry on Solid Phase", *LRA*, vol. 8, 1996, pp. 139-148.

Grigoriadis et al., "A Relational System for Managing High-Throughput Screening Data", Application Note, Apr. 1997, pp. 53-54.

Afferent Systems, Inc., "Afferent Analytical™", Copyright 1996-1999, 1 pg., http://www.afference.com/analytical.html., Jul. 3, 1999.

MDL Information Systems Inc., *Product News*, 1998, "MDL Screen 1.3 Closes Final Group in HTS Workflow", pp. 1-8.

*Network Science*, Nov. 15, 2003, "Introducing MDL Screen".

Maeda Katsumi et al., "ArF Chemically Amplified Positive Resist Based on Alicyclic Lactone Polymer", Publication Office Japanese Journal of Applied Physics, Tokyo, Japan, vol. 40, No. 12, Part 1, Dec. 2001, pp. 7162-7165.

Etsuo Hasegawa et al., "Molecular design and development of photoresists for ArF excimer laser lithography", *Polymers for Advanced Technologies*, vol. 11, 2000, pp. 560-569.

Robert D. Allen et al., "Protecting Groups for 193 nm Photoresists", *Proceedings of the SPIE*, Bellingham, VA, U.S., vol. 2724, 1996, pp. 334-343.

Afferent Systems, Inc., "What's New? IRORI and Afferent Enter Into Combinatorial Chemistry Collaboration Agreement", Jul. 3, 1999.

Moad et al., *The Chemistry of Free Radical Polymerization*, Eds. Pergamon Pub., 1995.

Lide, David R., *CRC Handbook of Chemistry and Physics*, CRC Press, Inc., 1995.

"Composition for Bleaching Teeth", *Research Disclosure*, Kenneth Mason Publishing, Hampshire, GB, Vo. 439, No. 66, Nov. 2000.

SYNTHESIS OF PHOTORESIST POLYMERS

CROSS-REFERENCE TO RELATED APPLICATION(S)

This application is a continuation of U.S. patent application Ser. No. 10/877,110, now U.S. Pat. No. 7,250,475 entitled "Synthesis of Photoresist Polymers," filed Jun. 25, 2005, which claims priority to U.S. Provisional Application Ser. No. 60/483,190, entitled "Synthesis of Photoresist Polymers", filed on Jun. 26, 2003, the contents of which are incorporated herein in their entirety.

BACKGROUND OF THE INVENTION

Processes for patterning semiconductor wafers typically rely on lithographic transfer of a desired image from a thin-film of radiation-sensitive resist material. The process entails the formation of a sacrificial layer, the "resist", which is photo-lithographically patterned. Generally these resists are referred to as "photoresists".

The patterning of the resist involves several steps, including exposing the resist to a selected light source through a suitable mask to record a latent image of the mask and then developing and removing selected regions of the resist. For a "positive" resist, the exposed regions are transformed to make such regions selectively removable; while for a "negative" resist, the unexposed regions are more readily removable.

The pattern can be transferred into surface texture in the wafer by etching with a reactive gas using the remaining, patterned resist as a protective masking layer. Alternatively, when a wafer is "masked" by the resist pattern, it can be processed to form active electronic devices and circuits by deposition of conductive or semiconductive materials or by implantation of dopants.

Materials used in single layer photoresists for optical lithography should meet several objectives. Low optical density at the exposure wavelength and resistance to image transfer processes, such as plasma etching, are two important objectives to be met by such a photoresist material. Shorter wavelengths of radiation permit greater resolution. The most common wavelengths currently used in semiconductor lithography are 365 nm, 248 nm and more recently 193 nm. The desire for narrower linewidths and greater resolution has fueled an interest in photoresist materials that can be patterned by even shorter wavelengths of light.

In the field of microfabrication, the processing size has become more and more minute in order to achieve higher integration. In recent years, development of lithographic processes enabling stable microfabrication with a line width of 0.5 microns, more preferably 0.2 microns or less, has been of keen interest.

However, it is difficult to form fine patterns with high accuracy using conventional methods which utilize visible rays (wavelength: 700-400 nm) or near ultraviolet rays (wavelength: 400-300 nm). To address this problem, lithographic processes using radiation with a shorter wavelength (wavelength: 300 nm or less) have been developed. Such shorter wavelength radiation can achieve a wider range of depth of focus and is effective for ensuring design rules with minimum dimensions.

Examples of short wavelength radiation, deep ultraviolet rays, such as those generated from a KrF excimer laser (wavelength: 248 nm), or an ArF excimer laser (wavelength: 193 nm) can be utilized as well as X-rays such as synchrotron radiation, charged particle rays such as electron beams and the like. However, the polymeric materials used with such processes are limiting in terms of composition, chemical resistance, transparency to DUV and physical characteristics.

There is a need in the art for novel polymeric materials that are transparent for use in DUV, to allow penetration of activating light, and that are robust enough to withstand further processing conditions.

BRIEF SUMMARY OF THE INVENTION

In one aspect, the present invention provides methods to prepare polymers having the formula

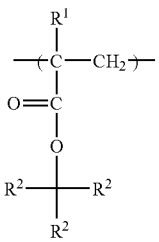

(1)

wherein $R^1$ represents a hydrogen atom or a methyl group, each $R^2$, individually, represents a linear or branched, non-substituted or substituted, alkyl group having 1-4 carbon atoms or a bridged or non-bridged, non-substituted or substituted, monovalent alicyclic hydrocarbon group having 4-20 carbon atoms, provided that at least one $R^2$ group is a linear or branched alkyl group having 1-4 carbon atoms, or any two $R^2$ groups form, in combination and together with the carbon atoms to which the two $R^2$ groups bond, a bridged or non-bridged, non-substituted or substituted, divalent alicyclic hydrocarbon group having 4-20 carbon atoms, with the remaining $R^2$ groups being a linear or branched, non-substituted or substituted, alkyl group having 1-4 carbon atoms or —$C(R_z)_3$ is one

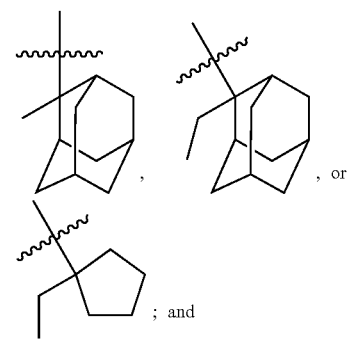

wherein the polymer is prepared by a living free radical process in the presence of a chain transfer agent (CTA) having the formula

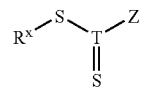

wherein $R^x$ is a group that is sufficiently labile to be expelled as its free radical form, T is carbon or phosphorus, and Z is any group that activates the C=S double bond towards a reversible free radical addition fragmentation reaction.

In certain embodiments, Z is selected from the group consisting of hydrocarbyl, substituted hydrocarbyl, heteroatom-containing hydrocarbyl, substituted heteroatom-containing hydrocarbyl, and combinations thereof.

In other embodiments, Z is selected from the group consisting of hydrogen, optionally substituted alkyl, optionally substituted aryl, optionally substituted alkenyl, optionally substituted acyl, optionally substituted, aroyl, optionally substituted alkoxy, optionally substituted heteroaryl, optionally substituted heterocyclyl, optionally substituted alkylsulfonyl, optionally substituted alkylsulfinyl, optionally substituted alkylphosphonyl, optionally substituted arylsulfinyl, and optionally substituted arylphosphonyl.

In a further aspect, the polymeric resins prepared by the methods of the invention can further include at least a second recurring unit having the formula

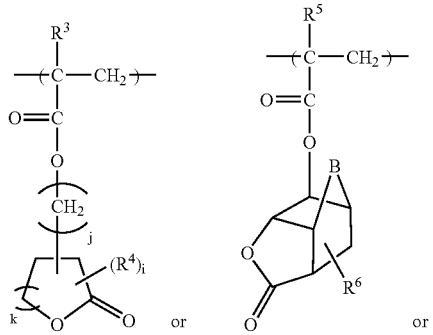

(2)

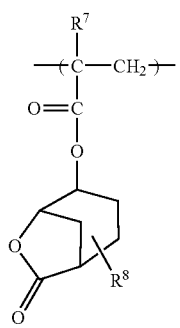

wherein $R^3$ represents a hydrogen atom or a methyl group, $R^4$ is a linear or branched alkyl group having 1-6 carbon atoms or a linear or branched alkyl group having 1-6 carbon atoms substituted with one or more alkyloxy, alkylcarbonyloxy or oxo groups, two or more $R^4$ groups, if present, being either the same or different, i is an integer of 0–(3+k), j is 0 or 1, k is an integer of 1-3, $R^5$ represents a hydrogen atom or a methyl group, B is a methylene group, an oxygen atom, or a sulfur atom, $R^6$ represents a hydrogen atom, a linear or branched alkyl group having 1-6 carbon atoms, or a linear or branched alkyl group having 1-6 carbon atoms substituted with one or more alkyloxy, alkylcarbonyloxy or oxo groups, $R^7$ represents a hydrogen atom or a methyl group, and $R^8$ represents a hydrogen atom, a linear or branched alkyl group having 1-6 carbon atoms, or a linear or branched alkyl group having 1-6 carbon atoms substituted with one or more alkyloxy, alkylcarbonyloxy or oxo groups.

The polymeric resins prepared by the methods of the present invention can further include at least one additional recurring unit having the formula

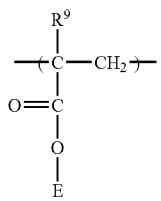

wherein where E represents a group derived from non-bridged or bridged, non-substituted or substituted alicyclic hydrocarbons and $R^9$ is a hydrogen atom, trifluoromethyl or a methyl group.

The polymeric resins prepared by the methods of the invention generally have a molecular weight of between about 2,000 and about 30,000. Additionally, the polymeric resins generally have a polydispersity is less than or equal to about 1.5. Lastly, the polymeric resins that are prepared by the methods of the invention generally include a CTA fragment that can be cleaved by methods disclosed throughout the specification.

In another aspect, the present invention pertains to methods to prepare a polymer having the formula $$[A]_x[B]_y[C]_z \qquad (I)$$

wherein A, B and C are each individually one of

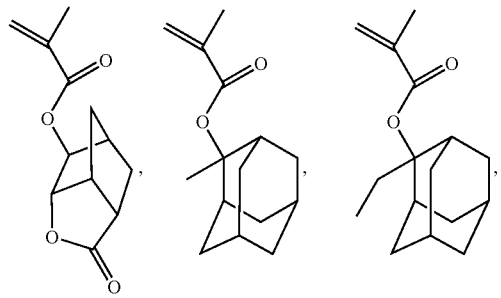

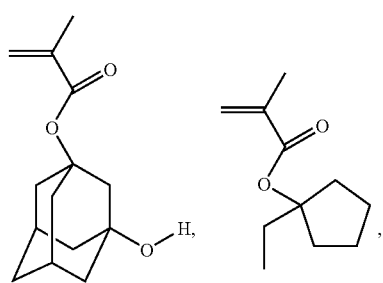

-continued

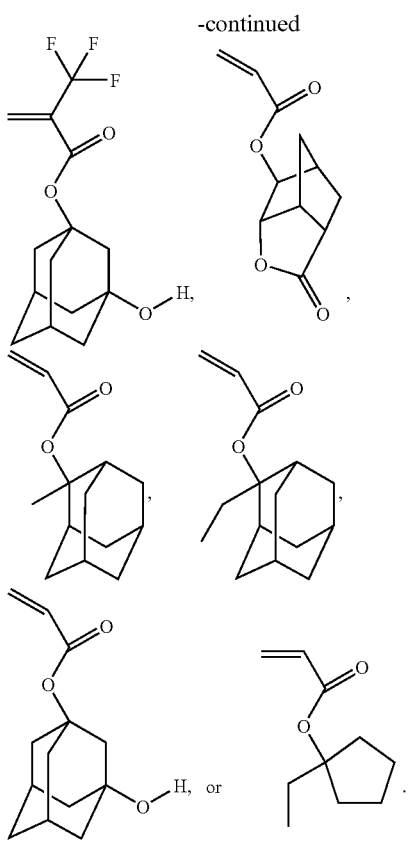

More particularly, "x" is between about 0 and about 200 inclusive, "y" is between about 1 and about 200 inclusive and "z" is between about 1 and about 200 inclusive. In general, the polymers of the invention are random copolymers and can be prepared in a batch process or under semi-continuous polymerization reaction conditions.

In certain aspects of the polymers of the invention, x has a value of at least 1.

In other aspects of the invention, the polymers prepared by the methods of the invention have a polydispersity index of less than about 1.7 and more specifically are between about 1.2 and about 1.4. Molecular weights ($M_w$) of the polymers of the invention have a range of from between about 2,000 to about 30,000.

In one embodiment, A, B and C, each individually, are selected from

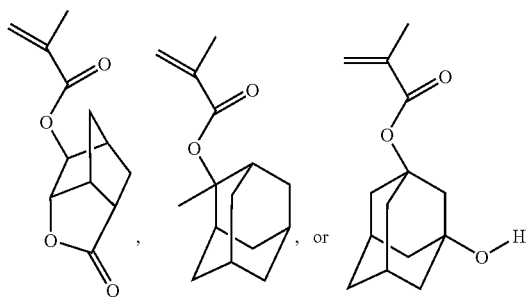

and x is at least one (1). In a specific embodiment, A, B and C are each different (A≠B≠C). For instance, an exemplary polymer is prepared with three different methacrylic monomers (A, B and C) is (II)

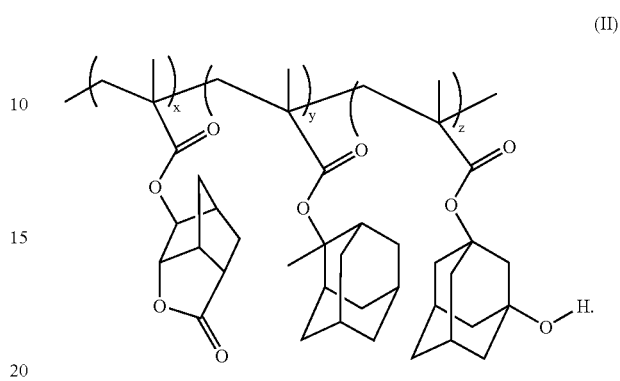

It should be understood by one skilled in the art, that in the polymeric formula $[A]_x[B]_y[C]_z$, monomeric subunits of A, B and C have been polymerized through their respective unsaturated olefinic portions into a resultant polymeric resin.

In another embodiment, A, B and C, each individually, are selected from

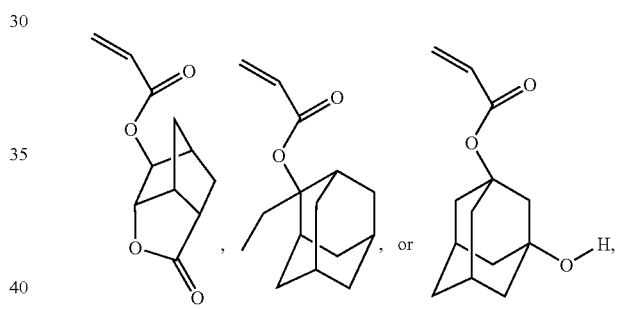

where x is at least one (1). For example, a polymer prepared from three different acrylic monomers (A, B and C) can be represented by the polymeric resin as (III)

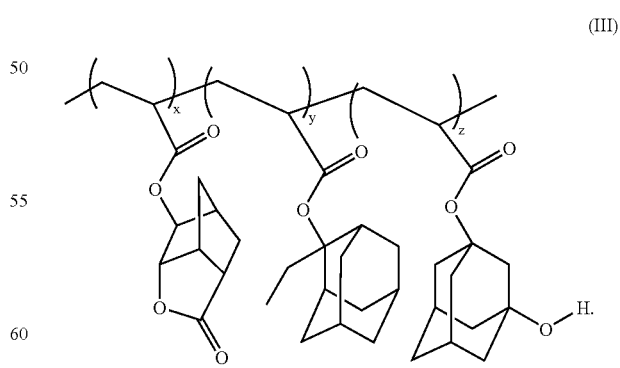

Therefore, both acrylic and methacrylic type esters having sterically bulky ester groups have been prepared and are encompassed by the present invention and are useful, for example, in coatings applications, e.g., photoresist materials.

In still another embodiment, A, B and C, each individually, are selected from

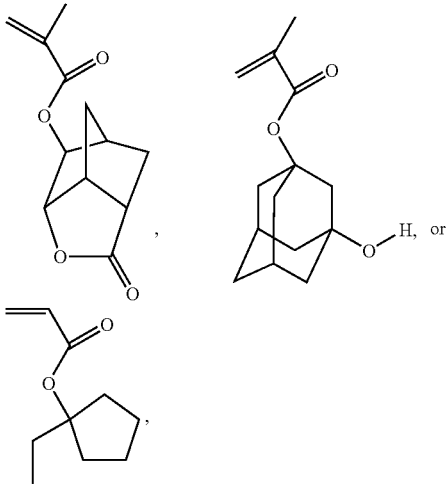

where x is at least one (1). For example, a polymer prepared from three different acrylic monomers (A, B and C) can be represented by the polymeric resin as (IV)

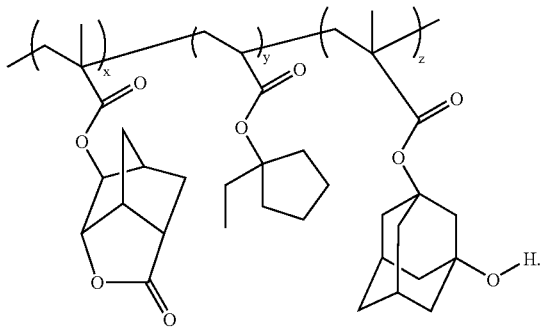

Therefore, both acrylic and methacrylic type esters, and mixtures thereof, having sterically bulky ester groups have been prepared and are encompassed by the present invention and are useful, for example, in coatings applications, e.g., photoresist materials.

In certain aspects of the invention, the terminal end position of the polymer (acrylic or methacrylic derivatives) includes a thiocarbonylthio moiety. The thiocarbonylthio moiety can be also be subjected to cleavage conditions so that in one embodiment, the terminal end position of the polymer includes a termination group having the formula

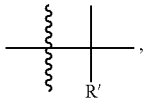

wherein R' is CN or COOMe. Alternatively, the terminal position can be capped by a hydrogen atom, a monomeric unit or with a RAFT group depending upon the conditions selected.

While multiple embodiments are disclosed, still other embodiments of the present invention will become apparent to those skilled in the art from the following detailed description, which shows and describes illustrative embodiments of the invention. As will be realized, the invention is capable of modifications in various obvious aspects, all without departing from the spirit and scope of the present invention. Accordingly, the drawings and detailed description are to be regarded as illustrative in nature and not restrictive.

DETAILED DESCRIPTION

High absorption at 193 or 157 nm limits the light penetration into the resist and does not allow for complete resist exposure at the bottom of the resist. Without complete resist exposure, the resist cannot image properly. If the resist is made thin enough to ensure full exposure, it may not be sufficiently thick to withstand subsequent processing steps such as plasma etching or ion implantation. To compensate for this problem, resist designers often resort to multilayer resists in which a sufficient thin resist is deposited on top of a second resist that is more photoreactive. While these composite resists are effective, resolution is compromised by the undercutting or widening of the exposed areas during development. The present invention provides materials and methods to produce single or multilayer thin resists that are sufficiently thin so as to permit light to penetrate to the bottom of the resist while also being sufficiently thick enough to withstand etching and/or other post exposure processing steps. Conventional aqueous developers can be used to remove the exposed base soluble polymer after exposure to the radiant energy source.

The ability to form a photolithographic pattern is defined by Rayleigh's equation in which R represents a resolution or line width of an optical system. Rayleigh's equation is:

$R = k\lambda/NA$ wherein $\lambda$ represents a wavelength of an exposure light, NA is a numerical aperture of a lens, and k is a process factor. It should be understood from the Rayleigh equation that a wavelength $\lambda$ of an exposure light must decrease in value in order to accomplish a higher resolution or obtain a smaller R. For example, it is well known that a high pressure mercury vapor lamp emits a defined band of radiation (the "i-line") at a wavelength of 365 nm. Mercury vapor lamps have been used as a light source for manufacturing a dynamic random access memory (DRAM) having an integration equal to or smaller than 64M bits. Similarly, the KrF excimer laser emitting radiant energy at a wavelength of 248 nm is commonly used in a mass production of 256 bit DRAM devices. This manufacturing process requires a processing dimension smaller than 0.25 microns. Even shorter wavelengths are required for the manufacturing of DRAMs having an integration higher than 1 G bits. Such devices will require a processing dimension smaller than 0.2 microns. For this purpose, other excimer lasers such as the KrCl laser having a wavelength of 222 nm, the ArF laser having a wavelength of 193 nm and, the $F_2$ laser having a wavelength of 157 nm, are currently being investigated.

In one aspect, the present invention provides methods to prepare polymers having the formula

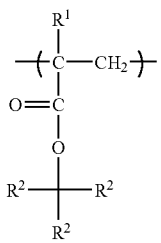
(1)

wherein $R^1$ represents a hydrogen atom or a methyl group, each $R^2$, individually, represents a linear or branched, non-substituted or substituted, alkyl group having 1-4 carbon atoms or a bridged or non-bridged, non-substituted or substituted, monovalent alicyclic hydrocarbon group having 4-20 carbon atoms, provided that at least one $R^2$ group is a linear or branched alkyl group having 1-4 carbon atoms, or any two $R^2$ groups form, in combination and together with the carbon atoms to which the two $R^2$ groups bond, a bridged or non-bridged, non-substituted or substituted, divalent alicyclic hydrocarbon group having 4-20 carbon atoms, with the remaining $R^2$ groups being a linear or branched, non-substituted or substituted, alkyl group having 1-4 carbon atoms or —$C(R_2)_3$, is one of

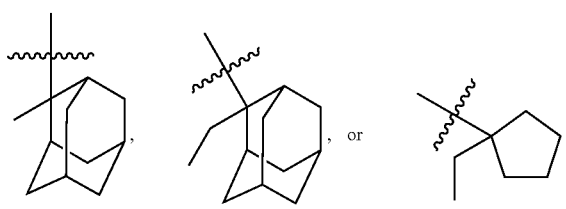

such that the

indicates that the bond carbon bond is directly attached to the ester oxygen; and wherein the polymer is prepared by a living free radical process in the presence of a chain transfer agent (CTA) having the formula

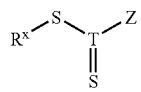

wherein $R^x$ is a group that is sufficiently labile to be expelled as its free radical form, T is carbon or phosphorus, and Z is any group that activates the C=S double bond towards a reversible free radical addition fragmentation reaction.

In certain embodiments, Z is selected from the group consisting of hydrocarbyl, substituted hydrocarbyl, heteroatom-containing hydrocarbyl, substituted heteroatom-containing hydrocarbyl, and combinations thereof.

In other embodiments, Z is selected from the group consisting of hydrogen, optionally substituted alkyl, optionally substituted aryl, optionally substituted alkenyl, optionally substituted acyl, optionally substituted, aroyl, optionally substituted alkoxy, optionally substituted heteroaryl, optionally substituted heterocyclyl, optionally substituted alkylsulfonyl, optionally substituted alkylsulfinyl, optionally substituted alkylphosphonyl, optionally substituted arylsulfinyl, and optionally substituted arylphosphonyl.

In a further aspect, the polymeric resins of the invention can be prepared to further include at least a second recurring unit selected from at least one of

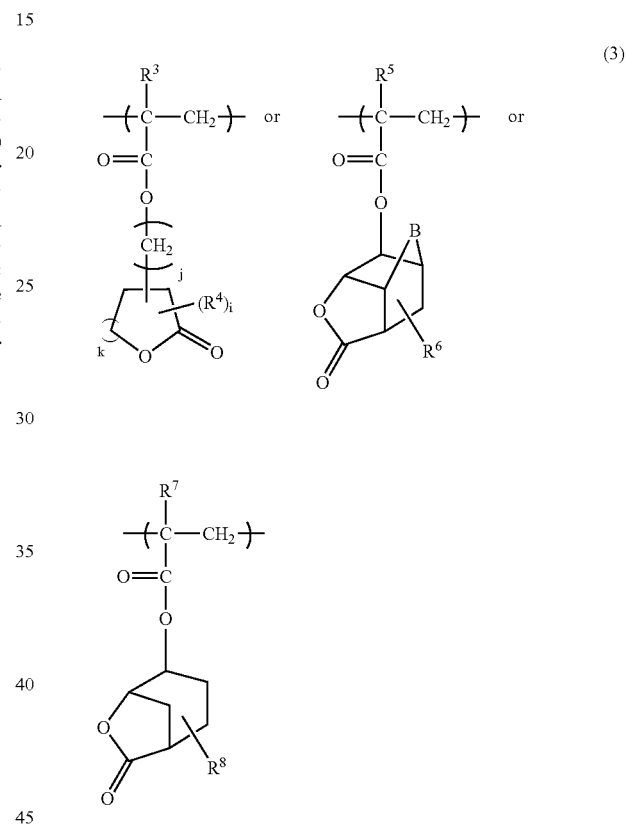
(3)

wherein $R^3$ represents a hydrogen atom or a methyl group, $R^4$ is a linear or branched alkyl group having 1-6 carbon atoms or a linear or branched alkyl group having 1-6 carbon atoms substituted with one or more alkyloxy, alkylcarbonyloxy or oxo groups, two or more $R^4$ groups, if present, being either the same or different, i is an integer of 0–(3+k), j is 0 or 1, k is an integer of 1-3, $R^5$ represents a hydrogen atom or a methyl group, B is a methylene group, an oxygen atom, or a sulfur atom, $R^6$ represents a hydrogen atom, a linear or branched alkyl group having 1-6 carbon atoms, or a linear or branched alkyl group having 1-6 carbon atoms substituted with one or more alkyloxy, alkylcarbonyloxy or oxo groups, $R^7$ represents a hydrogen atom or a methyl group, and $R^8$ represents a hydrogen atom, a linear or branched alkyl group having 1-6 carbon atoms, or a linear or branched alkyl group having 1-6 carbon atoms substituted with one or more alkyloxy, alkylcarbonyloxy or oxo groups.

The methods of the invention further provide ways to synthesize polymeric resins that can further include at least one additional recurring unit having the formula

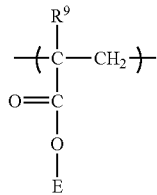

(4)

wherein where E represents a group derived from non-bridged or bridged, non-substituted or substituted alicyclic hydrocarbons and $R^9$ is a hydrogen atom, trifluoroethyl or a methyl group.

The polymeric resins prepared by methods of the invention generally have a molecular weight of between about 2,000 and about 30,000. Additionally, the polymeric resins generally have a polydispersity is less than or equal to about 1.5. Lastly, the polymeric resins that are prepared by the methods of the invention generally include a CTA fragment that can be cleaved by methods disclosed throughout the specification.

It should be understood that combinations of all monomers (and monomeric units derived from polymers presented herein) are within the scope of the invention.

In one aspect of the invention, the polymeric resin prepared by the methods of the invention is insoluble or scarcely soluble in alkali but becomes alkali soluble by action of an acid. The polymeric resin having the general formula (1), as described above, is prepared by LFRP in the presence of a CTA, as described throughout the specification. This polymeric resin is hereinafter referred to as "polymeric resin (A)".

The term "insoluble or scarcely soluble in alkali" used herein refers to characteristics in which 50% or more of the initial film thickness remains after development in the case of developing a resist film consisting only of the resin (A) under alkaline development conditions employed when forming a resist pattern using a resist film formed of the radiation-sensitive resin composition comprising the resin (A).

The polymeric resin (A) prepared by the methods of the invention can include one or more additional recurring monomeric units described throughout the specification. For example, these recurring units include those noted above as those having formula (3) as described above. The polymeric resin (A) can also include recurring units having the formula (4) as described above.

As specific examples of the group shown by $-C(R^2)_3$ in the recurring unit (1), a t-butyl group and groups of the following formulas, or substituted versions thereof

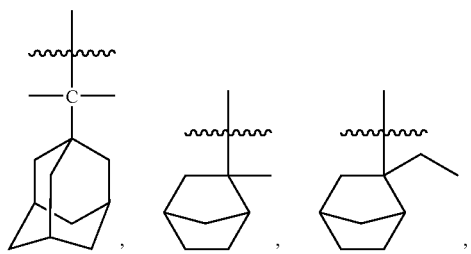

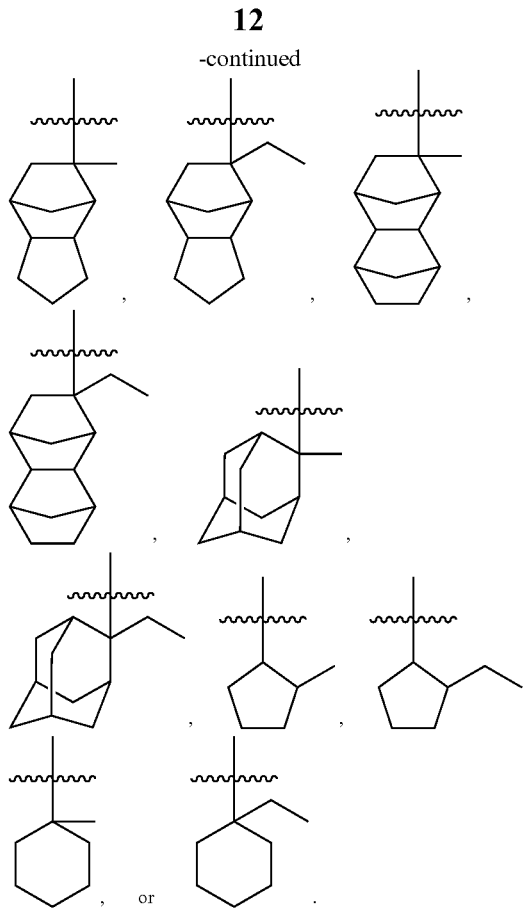

It should be understood that the above identified $-C(R^2)_3$ groups can be present either individually or in combination with one or more additional monomers within polymeric resin (A).

Specific example of recurring units having formula (3) include

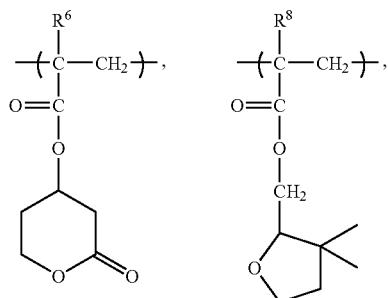

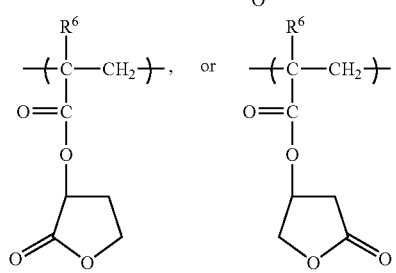

wherein $R^6$ is as defined above.

Alternatively, examples of recurring units having formula (3) include

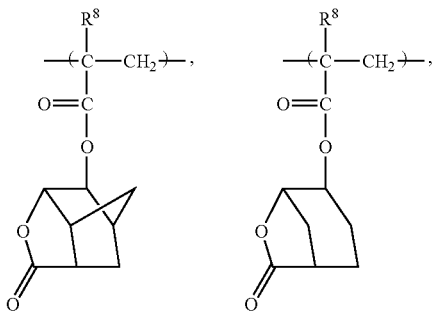

wherein $R^8$ is as defined above.

E in the formula (4) is a group derived from non-bridged or bridged alicyclic hydrocarbons, and more preferably groups derived from cyclohexane, norbornane, tricyclodecane, adamantane, or compounds in which these groups have one or more hydrogens replaced by a methyl group.

Suitable examples of the E structure in the formula (4) include hydroxymethyl group, 1-hydroxyethyl group, 2-hydroxyethyl group, 1-hydroxy-n-propyl group, 2-hydroxy-n-propyl group, 3-hydroxy-n-propyl group, 1-hydroxy-n-butyl group, 2-hydroxy-n-butyl group, 3-hydroxy-n-butyl group, 4-hydroxy-n-butyl group, 3-hydroxycyclopentyl group, 4-hydroxycyclohexyl group, 5-hydroxy-2-norbornyl group, 8-hydroxy-3-tricyclodecanyl group, 8-hydroxy-3-tetracyclododecanyl group, 3-hydroxy-1-adamantyl group, 3-oxocyclopentyl group, 4-oxocyclohexyl group, 5-oxo-2-norbornyl group, 8-oxo-3-tricyclodecanyl group, 8-oxo-3-tetracyclododecanyl group, 4-oxo-1-adamantyl group, cyanomethyl group, 2-cyanoethyl group, 3-cyano-n-propyl group, 4-cyano-n-butyl group, 3-cyanocyclopentyl group, 4-cyanocyclohexyl group, 5-cyano-2-norbornyl group, 8-cyano-3-tricyclodecanyl group, 8-cyano-3-tetracyclododecanyl group, 3-cyano-1-adamantyl group, 2-hydroxy-2,2-di(trifluoromethyl)ethyl group, 3-hydroxy-3,3-di(trifluoromethyl)-n-propyl group, 4-hydroxy-4,4-di(trifluoromethyl)-n-butyl group, 5-[2-hydroxy-2,2-di(trifluoromethyl)ethyl]-2-norbornyl group, 8-[2-hydroxy-2,2-di(trifluoromethyl)ethyl]-3-tricyclodecanyl group, 8-[2-hydroxy-2,2-di(trifluoromethyl)ethyl]-3-tetracyclododecanyl group, and 3-[2-hydroxy-2,2-di(trifluoromethyl)ethyl]-1-adamantyl group.

Of the above-identified E groups, 5-hydroxy-2-norbornyl group, 8-hydroxy-3-tricyclodecanyl group, 3-hydroxy-1-adamantyl group, 5-cyano-2-norbornyl group, 8-cyano-3-tricyclodecanyl group, 3-cyano-1-adamantyl group, 5-[2-hydroxy-2,2-di(trifluoromethyl)ethyl]-2-norbornyl group, 8-[2-hydroxy-2,2-di(trifluoromethyl)ethyl]-3-tricyclodecanyl group are of particular interest.

The percentage of recurring unit (1) in resin (A) is from about 10 to about 80 mol %, more particularly from about 20 to about 70 mol %, and still more specifically from about 20 to about 60 mol % of the total content of the recurring units. The total percentage of the recurring unit (3) or (4), in the resin (A) is from about 20 to about 80 mol %, more particularly from about 20 to about 60 mol %, and still more specifically from about 30 to about 60 mol % of the total content of the recurring units. The content of other recurring units described throughout the specification that can be incorporated into resin (A) is generally about 50 mol % or less, and more particularly 30 mol % or less of the total content of the recurring units.

The resin (A) can be prepared by LFRP. Polymerization of the unsaturated monomers is performed in an appropriate solvent, in the presence of a chain transfer agent (CTA), and a radical polymerization initiator such as a hydroperoxide, dialkyl peroxide, diacyl peroxide, or azo compound, as described throughout the specification.

The polystyrene-reduced weight average molecular weight (hereinafter referred to as "Mw") of the resin (A) determined by gel permeation chromatography (GPC) is generally from about 1,000 to about 100,000, more particularly from about 1,000 to about 50,000, and still more specifically from about 2,000-30,000 and still more specifically from about 4,000 to about 12,000.

The ratio of Mw to the polystyrene-reduced number average molecular weight (hereinafter referred to as "Mn") determined by gel permeation chromatography (GPC) (Mw/Mn) of the polymeric resin (A) is generally from about 1 to about 1.8, and more particularly from about 1 to about 1.5, e.g., about 1.6.

It is preferable that the resin (A) prepared by one or more methods of the invention contains almost no impurities such as halogens or metals. The smaller the amount of such impurities, the better the sensitivity, resolution, process stability, pattern shape, and the like of the polymeric resin when utilized in a coating such as, for example, in a photoresist. The resin (A) can be purified by using a chemical purification process, such as reprecipitation, washing with water, liquid-liquid extraction, or a combination of a chemical purification process and a physical purification process such as ultrafiltration or centrifugation.

The present invention is also based, at least in part, on the discovery that photosensitive compositions for use at wavelengths below 248 nm, i.e., 193 nm or 157 nm, can be formulated by combining a photo-acid generator and an acrylic or methacrylic based polymeric resin of the invention that includes ester groups that are sterically bulky. In one aspect, the ester moiety is a monocyclic, bicyclic, tricyclic, or tetracyclic non-aromatic ring, having 5 or more carbon atoms, and can further include a lactone within the cyclic structure. Generation of acid by photolysis in a photoresist composition induces cleavage of the ester group in the polymer resin. This results in a polymeric carboxylic acid that can be removed by treatment with base.

Suitable sterically bulky ester groups include those described throughout the specification and include, for example, cyclopentanes, cyclohexanes, adamantanes and norbornanes. Examples of monomers used for preparing the polymeric resins of the invention having the formula $[A]_x[B]_y[C]_z$ include

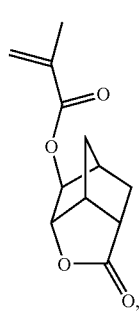

(N1)

-continued
(P1) 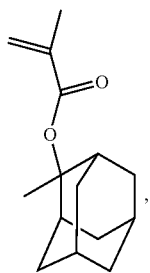
(P2) 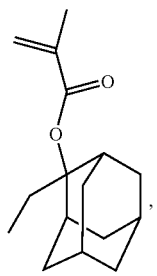
(Q1) 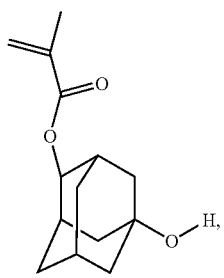
(P3) 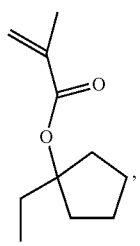
[F-Q2] 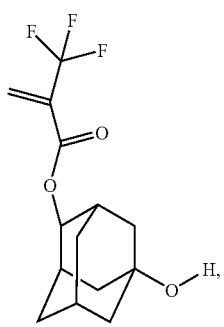
-continued
(N2) 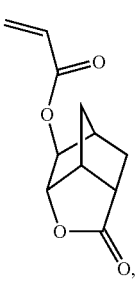
(P4) 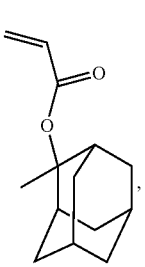
(P5) 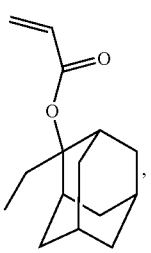
(Q3) 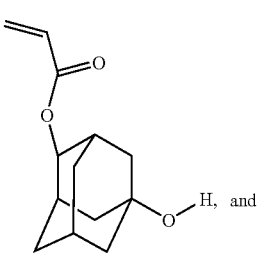
(P6) 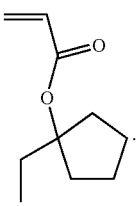
The monomers useful in the synthesis of the polymeric resins of the invention can be produced, for example, by reacting corresponding hydroxyl adamantans or norbornanes with either methacrylic or acrylic acid derivatives, such as acyl chloride or acetic anhydrides.

Typically, two or more of the above-identified monomers are polymerized in either a batch process, continuous, or a semi-continuous feed process.

In one aspect, polymer resins prepared within the scope of the invention have the formula $$[A]_x[B]_y[C]_z \qquad (I)$$

wherein A, B and C are each individually one of monomers described throughout the specification.

In one aspect of the invention, "x" is between about 0 to about 200 inclusive, "y" is between about 1 to about 200 inclusive and "z" is between about 1 to about 200 inclusive. In another aspect, "x", "y" and "z" are in the ranges of from about 5 to about 90, from about 10 to about 75, and from about 25 to about 50. In certain aspects of the polymeric resins of the invention, x has a value of at least 1.

In another aspect of the invention, "y" and "z" are zero and "x" is a non-zero integer, generally having a value of greater than about 10, therefore providing a homopolymer of the monomers identified throughout the application. In certain aspects, the homopolymers are prepared by the method(s) of the invention. In other aspects, the homopolymers do not include homopolymers of N1 or N2. As discussed throughout the specification, the homopolymers have a weight average molecular weight of between about 2,000 and about 30,000. Therefore, "x" is between about 10 and about 150. Such homopolymers of the invention have a polydispersity of less than about 2, more particularly less than about 1.7 and even more particularly between about 1.1 and about 1.4.

In yet another aspect of the invention "x" is at least one and x+y+z equal a total of at least 10. In another aspect, "x", "y" and "z" each individually are in the ranges of from about 5 to about 90, from about 10 to about 75, and from about 25 to about 50. In general, x+y+z equals at least about 10, more particularly at least about 20, and more specifically at least about 25.

In general, the polymer resins of the invention generally have a weight average molecular weight ($M_w$) of between about 2,000 and about 30,000. In certain aspects of the invention, the molecular weights of the polymeric resins are between about 2,000 and about 20,000, between about 3,000 and about 12,000 and also between about 3,000 and about 8,000.

Another important feature of the novel polymers encompassed by the methods of the present invention is their resulting narrow polydispersity. The terms "polydispersity" and "polydispersity index" (PDI) are recognized in the art and refer to the ratio of the weight average molecular weight to the number average molecular weight. Polymeric resins of the invention typically have PDI values below about 2, generally less than about 1.7 and in particular are between about 1.2 to about 1.4. In some instances, the PDI value is between about 1.1 to about 1.2 or less.

In one embodiment, A, B and C, each individually, are selected from

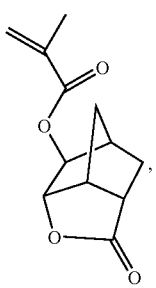, 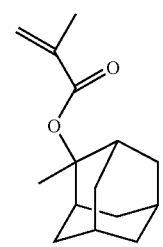,

-continued

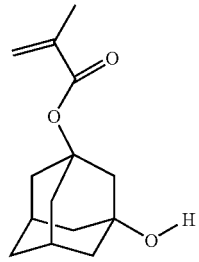

and x is at least one (1). In a specific embodiment, A, B and C are each different (A≠B≠C). In one aspect, the ratio of monomers A, B and C are formulated as 50, 35 and 15, respectively, based on weight percent. More specifically, an exemplary polymeric resin utilizes each of the three different methacrylic monomers (A, B and C) listed supra and has the formula

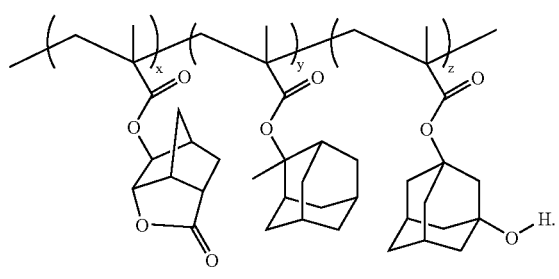

(II)

Again, it should be understood by one skilled in the art, that in the polymeric formula $[A]_x[B]_y[C]_z$, monomeric subunits of A, B and C have been polymerized through their respective unsaturated olefinic portions into a resultant polymeric resin. Polymer resins pertaining to formula (II) generally have a $M_w$ of between about 3,000 and 12,000 and a PDI of between about 1.1 and about 1.2.

In another aspect, A, B and C, are each individually selected from

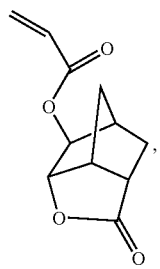, 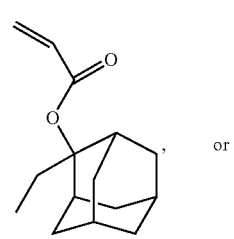, or

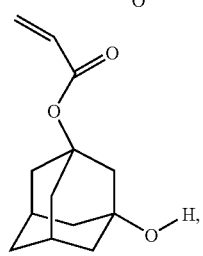

where x is at least one (1). In a specific embodiment, A, B and C are each different (A≠B≠C). In one aspect, the ratio of monomers A, B and C are formulated as 55, 35 and 10, respectively, based on weight percent. For example, a polymer prepared from the three different acrylic monomers (A, B and C) supra can be represented as a polymeric resin having the formula

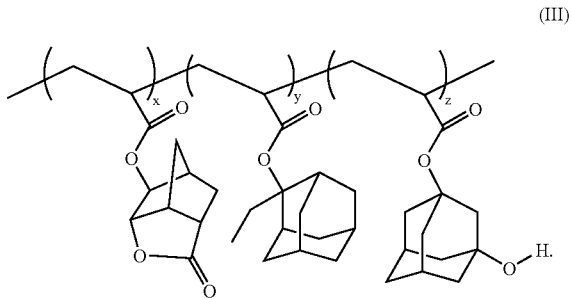

(III)

Polymer resins pertaining to formula (III) generally have a $M_w$ of between about 3,000 and 10,000 and a PDI of about 1.3.

In still another embodiment, A, B and C, each individually, are selected from

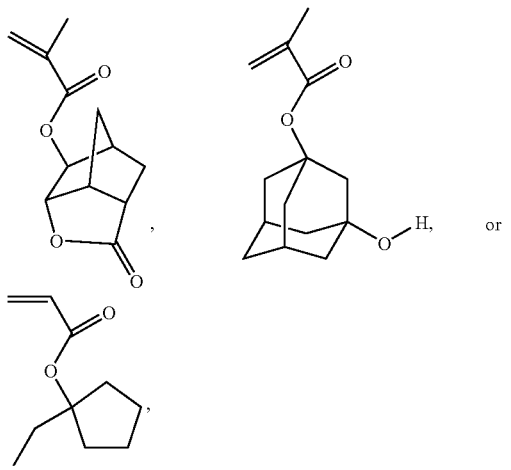

where x is at least one (1). In a specific embodiment, A, B and C are each different (A≠B≠C). In one aspect, the ratio of monomers A, B and C are formulated as 55, 35 and 10, respectively, based on weight percent. For example, a polymer prepared from an acrylic monomer and methacrylic monomers (A, B and C) can be represented by the polymeric resin as

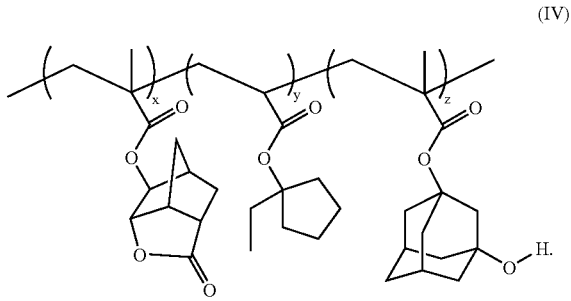

(IV)

Therefore, acrylic esters, methacrylic esters, and mixtures thereof having sterically bulky ester groups have been polymerized by the methods of the invention and are encompassed by the present invention and are useful, for example, in coatings applications, e.g., photoresist materials.

The present invention provides photosensitive polymeric resins of the chemical amplification type. The polymeric resins are suitable for use in photoresist systems where eximer laser lithography is utilized, such as ArF laser lithography, KrF laser lithography and the like. The polymeric resins of the invention provide excellent properties such as resolution, profile, sensitivity, dry etch resistance, adhesion and the like when used in photoresists.

Polymerization of the monomers (e.g., A, B and C) can be conducted according to conventional methods such as bulk polymerization or by semi-continuous polymerization. For example, the polymeric resin (I) can be obtained by dissolving requisite monomers in an organic solvent, then conducting a polymerization reaction in the presence of a polymerization initiator, such as an azo compound. Use of a chain transfer agent (CTA) during the polymerization process can be advantageous.

Organic solvents suitable for polymerization reactions of the invention include, for example, ketones, ethers, polar aprotic solvents, esters, aromatic solvents and aliphatic hydrocarbons, both linear and cyclic. Exemplary ketones include methyl ethyl ketone (2-butanone) (MEK), acetone and the like. Exemplary ethers include alkoxyalkyl ethers, such as methoxy methyl ether or ethyl ether, tetrahydrofuran, 1,4 dioxane and the like. Polar aprotic solvents include dimethyl formamide, dimethyl sulfoxide and the like. Suitable esters include alkyl acetates, such as ethyl acetate, methyl acetate and the like. Aromatic solvents include alkylaryl solvents, such as toluene, xylene and the like and halogenated aromatics such as chlorobenzene and the like. Hydrocarbon type solvents include, for example, hexane, cyclohexane and the like.

The polymerization conditions that can be used include temperatures for polymerization typically in the range of from about 20° C. to about 110° C., more specifically in the range of from about 50° C. to about 90° C. and even more specifically in the range of from about 60° C. to about 80° C. The atmosphere can be controlled, with an inert atmosphere being advantageous, such as nitrogen or argon. The molecular weight of the polymer is controlled via adjusting the ratio of monomer to CTA. Generally, the molar ratio of monomer to CTA is in the range of from about 5:1 to about 200:1, more specifically in the range of from about 10:1 to about 100:1, and most particularly from 10:1 to about 50:1.

A free radical source is provided in the polymerization mixture, which can stem from spontaneous free radical generation upon heating or in one aspect, from a free radical initiator (radical source generator). In the latter case the initiator is added to the polymerization mixture at a concentration high enough for an acceptable polymerization rate (e.g., commercially significant conversion in a certain period of time, such as listed below). Conversely, a too high free radical initiator to CTA ratio will favor unwanted dead polymer formation through radical-radical coupling reaction leading to polymer materials with uncontrolled characteristics. The molar ratio of free radical initiator to CTA for polymerization are typically in the range of from about 0.5:1 to about 0.02:1, e.g., 0.2:1.

The phrase "free-radical source," within the context of the invention, refers broadly to any and all compounds or mixtures of compounds that can lead to the formation of radical species under appropriate working conditions (thermal activation, irradiation, redox conditions, etc.).

Polymerization conditions also include the time for reaction, which can be from about 0.5 hours to about 72 hours, and more particularly in the range of from about 1 hour to about 24 hours, and even more particularly in the range of from about 2 hours to about 12 hours. Conversion of monomer to polymer is at least about 50%, more particularly at least about 75% and even more particularly at least about 90% or greater.

The initiators employed in the present invention can be a commercially available free-radical initiator. In general, however, initiators having a short half-life at the polymerization temperature are utilized in particular. Such initiators are utilized because the speed of the initiation process can affect the polydispersity index of the resulting polymer. That is, the kinetics of controlled, living polymerization are such that less polydisperse polymer samples are prepared if initiation of all chains occurs at substantially the same time. More specifically, suitable free radical initiators include any thermal, redox or photo initiators, including, for example, alkyl peroxides, substituted alkyl peroxides, aryl peroxides, substituted aryl peroxides, acyl peroxides, alkyl hydroperoxides, substituted alkyl hydroperoxides, aryl hydroperoxides, substituted aryl hydroperoxides, heteroalkyl peroxides, substituted heteroalkyl peroxides, heteroalkyl hydroperoxides, substituted heteroalkyl hydroperoxides, heteroaryl peroxides, substituted heteroaryl peroxides, heteroaryl hydroperoxides, substituted heteroaryl hydroperoxides, alkyl peresters, substituted alkyl peresters, aryl peresters, substituted aryl peresters, azo compounds and halide compounds. Specific initiators include cumene hydroperoxide (CHP), t-butyl hydroperoxide (TBHP), t-butyl perbenzoate (TBPB), sodium carbonateperoxide, benzoyl peroxide (BPO), lauroyl peroxide (LPO), methylethylketone peroxide 45%, potassium persulfate, ammonium persulfate, 2,2-azobis(2,4-dimethyl-valeronitrile) (VAZO®-65), 1,1-azobis(cyclohexanecarbonitrile) (VAZO®-40), 2,2-azobis(N,N'-dimethyleneisobutyramidine) dihydrochloride (VAZO®-044), 2,2-azobis(2-amidino-propane) dihydrochloride (VAZO®-50) and 2,2-azobis(2-amido-propane) dihydrochloride. Redox pairs such as persulfate/sulfite and Fe(2+)/peroxide are also useful. Initiation may also be by heat or UV light, as is known in the art, depending on the embodiment being practiced (e.g., UV light may be used for the modified initiator or RAFT or MADIX techniques discussed herein). Those of skill in the art can select a proper initiator within the scope of this invention.

Chain transfer agents (CTAs) are known in the art and are used to help control free radical polymerizations. Ultimately, many different types of CTAs can be incorporated into the terminus of a polymer as further explained below. Examples of suitable CTAs useful in the present invention include those described in U.S. Pat. No. 6,512,021, WO98/01478, WO99/35177, WO99/31144, WO99/05099 and WO98/58974, each of which is incorporated herein by reference.

Additional examples include CTAs described in U.S. Pat. Nos. 6,395,850, 6,518,364, U.S. patent application Ser. No. 10/407,405, entitled "Cleaving and Replacing Thio Control Agent Moieties from Polymers made by Living-Type Free Radical Polymerization" filed on Apr. 3, 2003 and U.S. patent application Ser. No. 10/104,740, filed Mar. 22, 2002, the teachings of which are incorporated herein by reference in their entirety.

The use and mechanism of reversible control agents for free radical polymerization is now generally known and coined as RAFT (Reversible Addition Fragmentation Transfer), see for example, U.S. Pat. No. 6,153,705, WO 98/01478, WO 99/35177, WO 99/31144, and WO 98/58974, each of which is incorporated herein by reference. Recently new agents have been disclosed which are readily available for polymerizing desired monomers under commercially acceptable conditions, which include high conversion at the shortest possible reaction times and lower temperatures, see for example U.S. Pat. Nos. 6,380,335, 6,395,850, and 6,518,364, each of which is incorporated herein by reference.

In general CTAs useful in the present invention have the general formula:

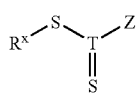

wherein $R^x$ is generally any group that is sufficiently labile to be expelled as its free radical form, T is carbon or phosphorus, and Z is any group that activates the C=S double bond towards a reversible free radical addition fragmentation reaction and may be selected from the group consisting of amino and alkoxy. In other embodiments, Z is attached to C=S through a carbon atom (dithioesters), a nitrogen atom (dithiocarbamate), a sulfur atom (trithiocarbonate) or an oxygen atom (dithiocarbonate). Specific examples for Z can be found in WO98/01478, WO99/35177, WO99/31144, and WO98/58974, each of which is incorporated herein by reference. In some embodiments, Z is selected from the group consisting of hydrocarbyl, substituted hydrocarbyl, heteroatom-containing hydrocarbyl, substituted heteroatom-containing hydrocarbyl, and combinations thereof. More specifically, Z may be selected from the group consisting of hydrogen, optionally substituted alkyl, optionally substituted aryl, optionally substituted alkenyl, optionally substituted acyl, optionally substituted, aroyl, optionally substituted alkoxy, optionally substituted heteroaryl, optionally substituted heterocyclyl, optionally substituted alkylsulfonyl, optionally substituted alkylsulfinyl, optionally substituted alkylphosphonyl, optionally substituted arylsulfinyl, and optionally substituted arylphosphonyl.

In particular, suitable CTAs useful in the present invention include those identified in U.S. Pat. No. 6,380,335, the contents of which are incorporated by reference. More specifically, CTAs of particular interest in combination with the monomers utilized throughout the specification can be characterized by the general formula:

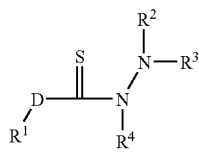

wherein D is S, Te or Se. In one aspect, D is sulfur. R¹ is generally any group that can be easily expelled under its free radical form (R¹●) upon an addition-fragmentation reaction, as depicted below in Scheme A (showing D as S):

Scheme A

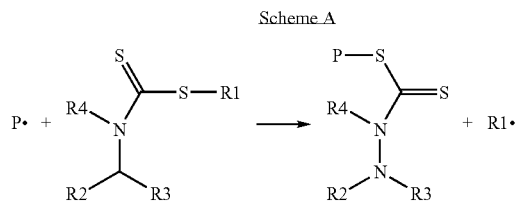

In Scheme A, P● is a free radical, typically a macroradical, such as polymer chain. More specifically, R¹ is selected from the group consisting of hydrocarbyl, substituted hydrocarbyl, heteroatom-containing hydrocarbyl, and substituted heteroatom-containing hydrocarbyl, and combinations thereof. Even more specifically, R¹ is selected from the group consisting of optionally substituted alkyl, optionally substituted aryl, optionally substituted alkenyl, optionally substituted alkoxy, optionally substituted heterocyclyl, optionally substituted alkylthio, optionally substituted amino and optionally substituted polymer chains. And still more specifically, R¹ is selected from the group consisting of —CH₂Ph, —CH(CH₃)CO₂CH₂CH₃, —CH(CO₂CH₂CH₃)₂, —C(CH₃)₂CN, —CH(Ph)CN, —C(CH₃)₂CO₂R (alkyl, aryl, etc.) and —C(CH₃)₂Ph.

Also, R² and R³ of the CTA are each independently selected from the group consisting of hydrogen, hydrocarbyl, substituted hydrocarbyl, heteroatom-containing hydrocarbyl, and substituted heteroatom-containing hydrocarbyl, and combinations thereof. More specifically, R² and R³ can be each independently selected from the group consisting of hydrogen, optionally substituted alkyl, optionally substituted aryl, optionally substituted alkenyl, optionally substituted acyl, optionally substituted, aroyl, optionally substituted alkoxy, optionally substituted heteroaryl, optionally substituted heterocyclyl, optionally substituted alkylsulfonyl, optionally substituted alkylsulfinyl, optionally substituted alkylphosphonyl, optionally substituted arylsulfinyl, and optionally substituted arylphosphonyl. Specific embodiments of R² and/or R³ are listed in the above definitions, and in addition include perfluorenated aromatic rings, such as perfluorophenyl. Also optionally, R² and R³ can together form a double bond alkenyl moiety off the nitrogen atom, and in that case R² and R³ are together optionally substituted alkenyl moieties.

Finally, R⁴ of the CTA is selected from the group consisting of hydrogen, hydrocarbyl, substituted hydrocarbyl, heteroatom-containing hydrocarbyl, and substituted heteroatom-containing hydrocarbyl, and combinations thereof; and optionally, R⁴ combines with R² and/or R³ to form a ring structure, with said ring having from 3 to 50 non-hydrogen atoms. In particular, R⁴ is selected from the group consisting of hydrogen, optionally substituted alkyl, optionally substituted aryl, optionally substituted alkenyl, optionally substituted acyl, optionally substituted aryl, amino, thio, optionally substituted aryloxy and optionally substituted alkoxy. Specific R⁴ groups include methyl and phenyl.

As used herein, the phrase "having the structure" is not intended to be limiting and is used in the same way that the term "comprising" is commonly used. The term "independently selected from the group consisting of" is used herein to indicate that the recited elements, e.g., R groups or the like, can be identical or different (e.g., R² and R³ in the structure of formula (1) may all be substituted alkyl groups, or R² may be hydrido and R³ may be methyl, etc.).

"Optional" or "optionally" means that the subsequently described event or circumstance may or may not occur, and that the description includes instances where said event or circumstance occurs and instances where it does not. For example, the phrase "optionally substituted hydrocarbyl" means that a hydrocarbyl moiety may or may not be substituted and that the description includes both unsubstituted hydrocarbyl and hydrocarbyl where there is substitution.

The term "alkyl" as used herein refers to a branched or unbranched saturated hydrocarbon group typically although not necessarily containing 1 to about 24 carbon atoms, such as methyl, ethyl, n-propyl, isopropyl, n-butyl, isobutyl, t-butyl, octyl, decyl, and the like, as well as cycloalkyl groups such as cyclopentyl, cyclohexyl and the like. Generally, although again not necessarily, alkyl groups herein contain 1 to about 12 carbon atoms. The term "lower alkyl" intends an alkyl group of one to six carbon atoms, preferably one to four carbon atoms. "Substituted alkyl" refers to alkyl substituted with one or more substituent groups, and the terms "heteroatom-containing alkyl" and "heteroalkyl" refer to alkyl in which at least one carbon atom is replaced with a heteroatom.

The term "alkenyl" as used herein refers to a branched or unbranched hydrocarbon group typically although not necessarily containing 2 to about 24 carbon atoms and at least one double bond, such as ethenyl, n-propenyl, isopropenyl, n-butenyl, isobutenyl, octenyl, decenyl, and the like. Generally, although again not necessarily, alkenyl groups herein contain 2 to about 12 carbon atoms. The term "lower alkenyl" intends an alkenyl group of two to six carbon atoms, preferably two to four carbon atoms. "Substituted alkenyl" refers to alkenyl substituted with one or more substituent groups, and the terms "heteroatom-containing alkenyl" and "heteroalkenyl" refer to alkenyl in which at least one carbon atom is replaced with a heteroatom.

The term "alkynyl" as used herein refers to a branched or unbranched hydrocarbon group typically although not necessarily containing 2 to about 24 carbon atoms and at least one triple bond, such as ethynyl, n-propynyl, isopropynyl, n-butynyl, isobutynyl, octynyl, decynyl, and the like. Generally, although again not necessarily, alkynyl groups herein contain 2 to about 12 carbon atoms. The term "lower alkynyl" intends an alkynyl group of two to six carbon atoms, preferably three or four carbon atoms. "Substituted alkynyl" refers to alkynyl substituted with one or more substituent groups, and the terms "heteroatom-containing alkynyl" and "heteroalkynyl" refer to alkynyl in which at least one carbon atom is replaced with a heteroatom.

The term "alkoxy" as used herein intends an alkyl group bound through a single, terminal ether linkage; that is, an "alkoxy" group may be represented as —O-alkyl where alkyl is as defined above. A "lower alkoxy" group intends an alkoxy group containing one to six, more preferably one to four, carbon atoms. The term "aryloxy" is used in a similar fashion, with aryl as defined below.

Similarly, the term "alkyl thio" as used herein intends an alkyl group bound through a single, terminal thioether linkage; that is, an "alkyl thio" group may be represented as —S-alkyl where alkyl is as defined above. A "lower alkyl thio" group intends an alkyl thio group containing one to six, more preferably one to four, carbon atoms.

The term "allenyl" is used herein in the conventional sense to refer to a molecular segment having the structure —CH=C=CH2. An "allenyl" group may be unsubstituted or substituted with one or more non-hydrogen substituents.

The term "aryl" as used herein, and unless otherwise specified, refers to an aromatic substituent containing a single aromatic ring or multiple aromatic rings that are fused together, linked covalently, or linked to a common group such as a methylene or ethylene moiety. The common linking group may also be a carbonyl as in benzophenone, an oxygen atom as in diphenylether, or a nitrogen atom as in diphenylamine. Preferred aryl groups contain one aromatic ring or two fused or linked aromatic rings, e.g., phenyl, naphthyl, biphenyl, diphenylether, diphenylamine, benzophenone, and the like. In particular embodiments, aryl substituents have 1 to about 200 carbon atoms, typically 1 to about 50 carbon atoms, and preferably 1 to about 20 carbon atoms. "Substituted aryl" refers to an aryl moiety substituted with one or more substituent groups, (e.g., tolyl, mesityl and perfluorophenyl) and the terms "heteroatom-containing aryl" and "heteroaryl" refer to aryl in which at least one carbon atom is replaced with a heteroatom.

The term "aralkyl" refers to an alkyl group with an aryl substituent, and the term "aralkylene" refers to an alkylene group with an aryl substituent; the term "alkaryl" refers to an aryl group that has an alkyl substituent, and the term "alkarylene" refers to an arylene group with an alkyl substituent.

The terms "halo" and "halogen" are used in the conventional sense to refer to a chloro, bromo, fluoro or iodo substituent. The terms "haloalkyl," "haloalkenyl" or "haloalkynyl" (or "halogenated alkyl," "halogenated alkenyl," or "halogenated alkynyl") refers to an alkyl, alkenyl or alkynyl group, respectively, in which at least one of the hydrogen atoms in the group has been replaced with a halogen atom.

The term "heteroatom-containing" as in a "heteroatom-containing hydrocarbyl group" refers to a molecule or molecular fragment in which one or more carbon atoms is replaced with an atom other than carbon, e.g., nitrogen, oxygen, sulfur, phosphorus or silicon. Similarly, the term "heteroalkyl" refers to an alkyl substituent that is heteroatom-containing, the term "heterocyclic" refers to a cyclic substituent that is heteroatom-containing, the term "heteroaryl" refers to an aryl substituent that is heteroatom-containing, and the like. When the term "heteroatom-containing" appears prior to a list of possible heteroatom-containing groups, it is intended that the term apply to every member of that group. That is, the phrase "heteroatom-containing alkyl, alkenyl and alkynyl" is to be interpreted as "heteroatom-containing alkyl, heteroatom-containing alkenyl and heteroatom-containing alkynyl."

"Hydrocarbyl" refers to univalent hydrocarbyl radicals containing 1 to about 30 carbon atoms, preferably 1 to about 24 carbon atoms, most preferably 1 to about 12 carbon atoms, including branched or unbranched, saturated or unsaturated species, such as alkyl groups, alkenyl groups, aryl groups, and the like. The term "lower hydrocarbyl" intends a hydrocarbyl group of one to six carbon atoms, preferably one to four carbon atoms. "Substituted hydrocarbyl" refers to hydrocarbyl substituted with one or more substituent groups, and the terms "heteroatom-containing hydrocarbyl" and "heterohydrocarbyl" refer to hydrocarbyl in which at least one carbon atom is replaced with a heteroatom.

By "substituted" as in "substituted hydrocarbyl," "substituted aryl," "substituted alkyl," "substituted alkenyl" and the like, as alluded to in some of the aforementioned definitions, is meant that in the hydrocarbyl, hydrocarbylene, alkyl, alkenyl or other moiety, at least one hydrogen atom bound to a carbon atom is replaced with one or more substituents that are groups such as hydroxyl, alkoxy, thio, phosphino, amino, halo, silyl, and the like. When the term "substituted" appears prior to a list of possible substituted groups, it is intended that the term apply to every member of that group. That is, the phrase "substituted alkyl, alkenyl and alkynyl" is to be interpreted as "substituted alkyl, substituted alkenyl and substituted alkynyl." Similarly, "optionally substituted alkyl, alkenyl and alkynyl" is to be interpreted as "optionally substituted alkyl, optionally substituted alkenyl and optionally substituted alkynyl."

As used herein the term "silyl" refers to the —SiZ1Z2Z3 radical, where each of Z1, Z2, and Z3 is independently selected from the group consisting of hydrido and optionally substituted alkyl, alkenyl, alkynyl, aryl, aralkyl, alkaryl, heterocyclic, alkoxy, aryloxy and amino.

As used herein, the term "phosphino" refers to the group —PZ1Z2, where each of Z1 and Z2 is independently selected from the group consisting of hydrido and optionally substituted alkyl, alkenyl, alkynyl, aryl, aralkyl, alkaryl, heterocyclic and amino.

The term "amino" is used herein to refer to the group —NZ1Z2, where each of Z1 and Z2 is independently selected from the group consisting of hydrido and optionally substituted alkyl, alkenyl, alkynyl, aryl, aralkyl, alkaryl and heterocyclic.

The term "thio" is used herein to refer to the group —SZ1, where Z1 is selected from the group consisting of hydrido and optionally substituted alkyl, alkenyl, alkynyl, aryl, aralkyl, alkaryl and heterocyclic.

As used herein all reference to the elements and groups of the Periodic Table of the Elements is to the version of the table published by the Handbook of Chemistry and Physics, CRC Press, 1995, which sets forth the new IUPAC system for numbering groups.

In certain embodiments, $R^4$ combines with either $R^2$ or $R^3$ to form a substituted or unsubstituted pyrazole moiety.

Exemplary CTAs include, for example,

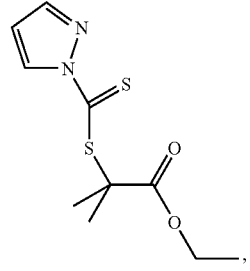

(CTA-HT7)

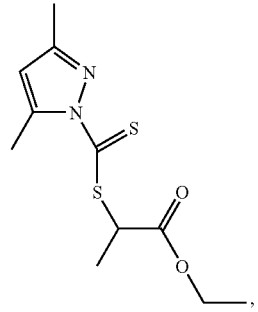

(CTA-HAB1)

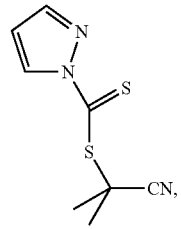

(CTA-HT3)

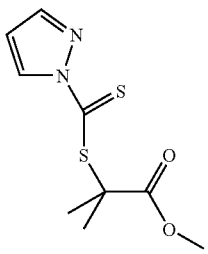

(CTA-HT8)

and

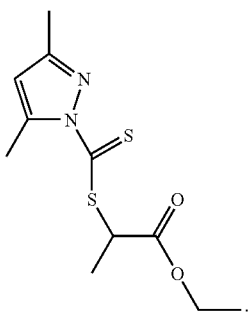

(CTA-HAB1)

In some embodiments, the resulting polymers of the invention described above will have one or more termini having, for example, a thio group (from a CTA). Depending on the application intended for the polymer, the thio group may be undesirable. Thus, this invention also provides polymeric resins that have the CTA eliminated from the polymeric resin termini.

In certain embodiments described throughout the specification, the resulting polymer contains a CTA moiety (a portion of the CTA, such as the dithio carbonyl portion) at a terminal end, whether the end is at the end of a backbone, a star arm, a comb end, a branch end, or a graft. Removal of the CTA can be accomplished by several methods described below. Mechanistically, a free radical chain transfer reaction is believed to decouple a residue, such as the dithio CTA moiety, from the polymer end by addition of an external radical source.

In one embodiment, it is advantageous in some instances to remove at least the sulfur containing portion of the CTA from the polymer terminal end (if present) position by cleaving the CTA moiety (e.g., a thiocarbonylthio moiety, a thio group) from the polymer terminus. In one embodiment, this can be accomplished by radical reduction of the dithiocarbonyl or dithiophosphoryl groups using a free radical intitiator and a compound bearing a labile hydrogen atom. The method essentially removes the unwanted group from the polymer chain end and replaces it with a hydrogen atom. See for example, WO 02/090397, which is incorporated herein by reference in its entirety.

In another aspect, the CTA can be replaced by use of excess initiator, whereby a fragmentation product of the initiator replaces the CTA at the termini of the polymer as described in U.S. patent application Ser. No. 10/407,405, entitled "Cleaving and Replacing Thio Control Agent Moieties from Polymers made by Living-Type Free Radical Polymerization" filed on Apr. 3, 2003, the teachings of which are incorporated herein by reference in their entirety.

In yet another aspect, the CTA can be replaced by use of initiator in combination with a RAFT agent as described in U.S. patent application Ser. No. 10/407,405, entitled "Cleaving and Replacing Thio Control Agent Moieties from Polymers made by Living-Type Free Radical Polymerization" filed on Apr. 3, 2003, the teachings of which are incorporated herein by reference in their entirety.

In still another aspect, the CTA can be replaced by a non-homopolymerizable monomer that is introduced with the radical source as described in U.S. patent application Ser. No. 10/609,255, entitled "Removal of the Thiocarbonylthio or Thiophosphorylthio End Group of Polymers and Further Functionalization Thereof" filed on Jun. 26, 2003, the teachings of which is incorporated herein by reference in their entirety.

Wishing not to be bound to any particular theory, it is thought the cleavage of the thio group from the polymer proceeds through a set of reactions described below in Schemes 1 and 2:

$$I_2 \rightarrow 2I\bullet \quad \text{Scheme 1}$$

$$P\text{—}P\text{—}S\text{-}T(\!=\!S)\text{-}Z + I\bullet \rightarrow P\bullet + IS\text{-}T(\!=\!S)\text{-}Z \quad \text{Scheme 2}$$

where P represents the polymer, T is carbon or phosphorus, S is sulfur, $I_2$ a free radical source, $I\bullet$ is a free radical stemming from $I_2$ decomposition, and Z is as defined above. Scheme 1 represents the activation of the free radical initiator yielding radical $I\bullet$; and scheme 2 represents the addition-fragmentation of $I\bullet$ on the dithio-terminated polymer generating a polymer radical $P\bullet$.

In some embodiments, the external radical source is a common radical initiator, such as any initiator listed above. Regardless of its exact nature, the free-radical source implemented in the procedure according to the invention is utilized under cleavage reaction conditions that allow for the production of free radicals, which, in one embodiment, is accomplished via thermal activation, i.e., by raising the temperature of the reaction medium, usually to a temperature in the range of about room temperature (approximately 20° C.) to about 200° C., and specifically from about 40° C. to about 180° C., and more specifically from about 50° C. to about 120° C. In other embodiments, free radicals are produced via light activation. This includes free radical sources activatable by UV light, such as benzoin ethers, and benzophenone. High energy radiations such as Gamma rays and electron beams are also known to produce radicals.

The free-radical source utilized can be introduced into the reaction medium in one single increment. However, it can also be introduced gradually, either by portions or continuously.

The cleavage reaction conditions that can be used include conditions such as temperature, pressure, atmosphere, reaction times and ratios of reaction components. Temperatures useful are those in the range of from about room temperature (approximately 20° C.) to about 200° C., and specifically from about 40° C. to about 180° C., and more specifically from about 50° C. to about 120° C. In some embodiments, the atmosphere can be controlled, with an inert atmosphere being utilized, such as nitrogen or argon. In other embodiments, ambient atmosphere is used. The cleavage reaction conditions also include open or closed atmospheres and pressures at ambient conditions. In embodiments in which the cleavage reaction is carried out in a closed atmosphere, and the temperature is above room temperature, the pressure could rise as a result of any heated solvents. In some embodiments light control is also desired. Specifically, the reaction can be carried out in visible light, or under UV light.

The quantity of the free-radical source depends on its effectiveness, on the manner in which the source is introduced, and on the desired end product. The free-radical source that is utilized can be introduced in a quantity such that the amount of free radicals that can be released by the source is between about 1% and about 800% (molar), specifically between about 50% and about 400% (molar), and more specifically between about 100% and about 300% (molar), and more specifically between about 200% and about 300% in relation to the total molar amount of the groups in the polymers for which cleavage is desired. In some embodiments, complete removal or as near as complete as possible is desired and in those embodiments, an excess of free radical source is introduced.

The excess free radical source is intended to account for the side reactions that are well known in free radical processes such as those mentioned below (e.g. scheme 5), as well as the possible free radical loss caused by the cage effect. When available, the free radical source efficiency factor, f, defined as the ratio of active radicals to total radicals generated upon free radical source decomposition, can be used to adjust the concentration of 12.

Most known free radical sources can be used, as long as the half-life time (defined as the time after which half of the free radical source has been consumed) is between approximately 10 minutes and 20 hours.

Typical initiators that can be used as a free radical source are selected among alkyl peroxides, substituted alkyl peroxides, aryl peroxides, substituted aryl peroxides, acyl peroxides, alkyl hydroperoxides, substituted alkyl hydroperoxides, aryl hydroperoxides, substituted aryl hydroperoxides, heteroalkyl peroxides, substituted heteroalkyl peroxides, heteroalkyl hydroperoxides, substituted heteroalkyl hydroperoxides, heteroaryl peroxides, substituted heteroaryl peroxides, heteroaryl hydroperoxides, substituted heteroaryl hydroperoxides, alkyl peresters, substituted alkyl peresters, aryl peresters, substituted aryl peresters, dialkylperdicarbonate, inorganic peroxides, hyponitrites and azo compounds. Specific initiators include lauroyl and benzoylperoxide (BPO) and AIBN. Some azo compounds include 1,1'-Azobis(cyclohexane-1-carbonitrile), 2,2'-Azobis(4-methoxy-2,4-dimethyl valeronitrile), Dimethyl 2,2'-azobis(2-methylpropionate), 1-[(cyano-1-methylethyl)azo]formamide, 2,2'-Azobis(N-cyclohexyl-2-methylpropionamide), 2,2'-Azobis(2,4-dimethyl valeronitrile), 2,2'-Azobis(2-methylbutyronitrile), 2,2'-Azobis[N-(2-propenyl)-2-methylpropionamide], 2,2'-Azobis(N-butyl-2-methylpropionamide), 2,2'-Azobis[2-(5-methyl-2-imidazolin-2-yl)propane]dihydrochloride, 2,2'-Azobis[2-(2-imidazolin-2-yl)propane disulfate dihydrate, 2,2'-Azobis[N-(2-carboxyethyl)-2-methylpropionamidine]tetrahydrate, 2,2'-Azobis {2-[1-(2-hydroxyethyl)-2-imidazolin-2-yl]propane}dihydrochloride, 2,2'-Azobis {2-methyl-N-[1,1-bis(hydroxymethyl)-2-hydroxyethyl]propionamide, 2,2'-Azobis[2-methyl-N-(2-hydroxyethyl)propionamide], 2,2'-Azobis[2-(2-imidazolin-2-yl)propane]dihydrochloride, 2,2'-Azobis(2-methylpropionamide)dihydrochloride, 2,2'-Azobis[2-(3,4,5,6-tetrahydropyrimidin-2-yl)propane] dihydrochloride, 2,2'-Azobis[2-(2-imidazolin-2-yl) propane], and 2,2'-Azobis{2-methyl-N-[2-(1-hydroxybuthyl)]propionamide}. This includes initiators activatable by UV such as benzoin ethers, and benzophenone. Other initiators are activatable by high energy such as gamma rays and electron beams. The half-life time can be adjusted by setting the reaction temperature to the required range. The latter is determined by the temperature dependence of the initiator decomposition rate, available through the supplier information package or in the literature (e.g. "The Chemistry of Free Radical Polymerization, G. Moad, D. H. Salomon, Eds. Pergamon Pub. 1995). The rate of decomposition, hence the radical production, is also adjustable by the addition of reducing agents, in particular when the initiator has an oxidizing character, such as peroxides: for instance metabisulfite, ascorbic acid, sulfite-formaldehyde adduct, amines, and low oxidation state metals, etc., can be used together with peroxides type initiators to accelerate the radical flux.

Cleavage reaction conditions also include the time for reaction, which can be from about 0.5 hours to about 72 hours, more particularly in the range of from about 1 hour to about 24 hours, and even more particularly in the range of from about 2 hours to about 12 hours. Cleavage of thio group, for example, from the polymer is at least about 50%, more specifically at least about 75% and more specifically at least about 85%, and even more specifically at least about 95%. Replacement of the thio groups is at least about 50%, more specifically at least about 75% and more specifically at least about 85%, and even more specifically at least about 95%.

The thio groups can be replaced with a variety of different moieties as detailed above with various RAFT agents, etc. In one embodiment, as described in WO 02/090397 (assigned to Rhodia Chimie), the thio moiety of the CTA can be replaced by a hydrogen atom. In another embodiment, the thio group can be replaced by a non homopolymerizable monomer unit. In still another embodiment, only a free radical source is introduced to cap the polymer termin.

The cleavage reaction mixture can use a reaction media that is typically a solvent. Cleavage reaction conditions also include stirring or refluxing the reaction media. The resulting polymer radical, P●, can then be capped in one of three ways as shown below in Schemes 3, 4 and 5:

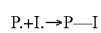  Scheme 3

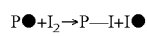  Scheme 4

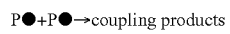  Scheme 5

Scheme 3 represents the radical coupling of the polymer radical generated in scheme 2 and the free radical generated in scheme 1, which produces the resulting capped polymer P—I. Scheme 4 represents a transfer reaction between the polymer radical generated in scheme 2 and the free radical initiator that produces the cleaved polymer as well a new free radical source. Scheme 5 represents a coupling reaction between two polymer radicals.

In one embodiment, schemes 3 and 4 are the desired reactions. Scheme 5 is a side reaction that contributes in increasing molecular weight and broadening molecular weight distribution of the bulk polymer sample. It has been found that the described cleavage reaction conditions lead to quantitative cleavage of dithiocompounds, for example, with little to no change in molecular weight characteristics (Mw and polydispersity index).

In one embodiment, the polymer is treated with free radical source, such as an initiator, under cleavage reaction conditions so that the reactions 3 and 4 are favored. These conditions include introducing the radical source in a quantity such that the amount of free radicals that can be released by the source is between about 200% and about 500% (molar), specifically between about 200% and about 300% (molar) in relation to the total molar amount of the groups in the polymers for which cleavage is desired.

The resulting polymer has a new group at its terminus which may make the polymer more desirable for specific applications. For example, the polymer above may be more desirable for applications that cannot allow the presence of sulfur in the amounts present in the polymer before modification, such as home and personal care products where odor may present a problem.

It is advantageous that the reaction product, either with a CTA terminal group or without, is purified by re-precipitation or the like, after completion of the polymerization reaction. Typical precipitation agents include low molecular weight alcohols, such as isopropyl, methyl, ethyl, and butyl alcohols.

Procedure for the Living Polymerization of Methacrylate and Acrylate Monomers Encompassed by the Invention The following is a general procedure for use with a CTA. (See Table I, column C) for the polymerization of monomers to form a polymer with the desired nominal compositions (Table I, column H) and targeted to have different molecular weights (Mw) at 100% conversion. The polymerization was conducted in an organic solvent, i.e., MEK (2-butanone) (which was degassed by three freeze-pump-thaw cycles) and the initiator MAIB (V601 from WAKO, 2,2'-dimethylazobis (methylpropionate)) was used to sustain the reaction. The stock solutions were made by weighing the monomers, CTA and initiator followed by cycling with vacuum into an oxygen free box where purified MEK was added.

Similar conditions can be used for other comonomer mixtures and with other CTAs. Target molecular weight is set as a molar ratio of the monomers to the CTA. The feed time can also be varied (Table I, column G). Feed times effect the target molecular weight, the polymer composition (due to reactivity ratios and the subsequent monomer drift) as well as the PDI.

For example, reaction conditions for CTA H-AB-1 with acrylates generally require a three hour feed time followed by six hours of continued heating at 65° C. In contrast, reaction conditions for CTA H-T-3 with methacrylates generally require six hours feed time followed by two hours of continued heating at 80° C.

Example to prepare a polymer with a nominal composition N1/P1/Q1(50/35/15) and Mw targeted at 6000 g/mol at 100% conversion using CTA-HT3 as controlling agent Stock Solutions (ss) are:
1) "Monomer Mixture": 17.830 g N1+16.708 g P1+6.315 g Q1+145 mL MEK
2) "MAIB Solution": 1.271 g MAIB+30 mL MEK
3) "CTA Solution": 1.417 g CTA-H-T-3+7.044 mL MEK to get 8.804 mL of stock solution
4) "MEK" (pure): 29.150 mL MEK Reaction:
1) A 500 mL glass reaction flask equipped with a magnetic stir bar and a reflux condenser was cycled into the glove box.
2) All of "CTA Solution" (8.804 mL), and all of the "MEK" were added to the reaction flask, as well as 1.918 mL of "MAIB Solution" and 19.285 mL of "Monomer Mixture" (10% of each of these solutions).
3) The reaction flask was then removed from the glove box and the mixture was degassed by three freeze-pump-thaw cycles, followed by backfilling of the system with high purity nitrogen or argon (and left under a bubbler of inert gas).
4) The "Monomer Mixture" and "MAIB Solution" were then primed on two feed pumps which were then attached to the reaction flask. (The sealed bottles of the two stock solutions were placed under an inert gas bubbler.)
5) The flask was the submerged into an oil bath at 85° C. and stirring was set at 400 rpm.
6) Once the reaction mixture reached 85° C., the semicontinuous addition of 173.57 mL of "Monomer Mixture" and 17.27 mL of "MAIB Solution" was begun, and added over the next six hours in a series of 100 equal volume injections while maintaining an internal temperature of 85° C.
7) Heating of the reaction mixture at 85° C. was continued for an additional two hours past the end of the feed.
8) The reactor was then cooled to room temperature (approximately 45-50 minutes). The reaction mixture was concentrated by removing half of the solvent (MEK). The mixture was then precipitated slowly into 2 L of isopropanol, washed with an additional 500 mL of isopropanol, and dried under vacuum at 45° C. for two days.
9) 35.2 g of dry polymer was isolated with an Mw=6200 g/mol, and a PDI=1.30 (sample 11693911). Other samples were prepared in similar fashion with an isolation of polymer ranging from 0.5 grams to 50 grams yield after precipitation.

Example to prepare a polymer with a nominal composition N2/P5/Q3(55/35/10) and Mw targeted at 15000 g/mol at 100% conversion using CTA-HAB1 as controlling agent.

Stock Solutions (ss) are:
1) "Monomer Mixture": 20.95 g N2+18.86 g P5+4.47 g Q3+110 mL MEK
2) "MAIB Solution": 0.636 g MAIB+15 mL MEK
3) "CTA Solution": 0.763 g CTA-H-AB-1+3.79 mL MEK
4) "MEK" (pure): 91 mL MEK Reaction:
5) A 500 mL glass reaction flask equipped with a magnet stir bar and a reflux condenser was cycled into the glove box.
6) All of "CTA Solution", and all of the "MEK" were added to the reaction flask, as well as 0.461 mL of "MAIB Solution" and 15.0 mL of "Monomer Mixture" (10% of each of these solutions).
7) The reaction flask was then removed from the glove box and the mixture was degassed by three freeze-pump-thaw cycles, followed by backfilling of the system with high purity nitrogen or argon (and left under a bubbler of inert gas).
8) The "Monomer Mixture" and "MAIB Solution" were then primed on two feed pumps which were then attached to the reaction flask. (The sealed bottles of the two stock solutions were placed under inert gas bubbler.)
9) The flask was the submerged into an oil bath at 70° C. and stirring was set at 400 rpm.
10) Once the reaction mixture reached 65° C., the semicontinuous addition of 135 mL of "Monomer Mixture" and 4.145 mL of "MAIB Solution" was begun, and added over the next three hours in a series of 100 equal volume injections while maintaining an internal temperature of 65° C.
11) Heating of the reaction mixture at 65° C. was continued for an additional three hours past the end of the feed.
12) The reactor was then cooled to room temperature (approximately 45-50 minutes) and the reaction mixture was precipitated slowly into 2 L of isopropanol, washed with an additional 500 mL of isopropanol, and dried under vacuum at 45° C. for two days.
13) 26 g of dry polymer was isolated with an Mw=6900, and a PDI=1.35 (sample 11692711 (A4)). Other samples were prepared in similar fashion with an isolation of polymer ranging from 0.5 grams to 50 grams yield after precipitation.

Example to prepare polymers with a nominal composition N1/P1/Q1(50/35/15) at different molecular weights using CTA-HT3 as controlling agent in a library format (116959)

Stock Solutions (ss) were prepared in an inert atmosphere and are typically:
1) "Monomer Mixture": 17.215 g N1+16.13 g P1+6.097 g Q1+140 mL MEK
2) "MAIB Solution": 1.896 g MAIB+50 mL MEK
3) "CTA Solution": 1.242 g CTA-H-T-3+3.6 mL MEK to get 5.143 mL of stock solution
4) "MEK" (pure): 29.150 mL MEK Reaction:
5) All of "CTA Solution" (ss-CTA-HT3) was preliminary equally added to 24 individual reactor vessels of a Semi-Continuous Parallel Pressurized Reactor (Table 3, "ss-CTA-HTs).
6) Three individuals lines (2,3 and 4) were respectively primed with solvent (MEK), ss-MAIB and monomer solution before sealing of the reactor vessels.
7) The reactor vessels were degassed by a pressurization, pressure relieve and backfilling under inert-cycles with high purity argon.
8) Solutions dispensed in each of the 24 reactor vessels were mentioned in Table 3 (in µL). All of the "MEK" (Line 2) was added to the reactions flasks, as well as 10% of "ss-MAIB Solution" (Line 3) and "ss-Monomer Mixture" (Line 4).

9) The temperature was set at 80° C. and stirring was set at 400 rpm.

10) Once the reaction mixture reached 79° C., semicontinuous addition of the remaining "Monomer Mixture" (line 4) and "MAIB Solution" (line 3) was begun, and added over the next six hours in a series of 100 equal volume injections while maintaining an internal temperature of 80° C.

11) Heating of the reaction mixture at 80° C. was continued for an additional two hours past the end of the feed.

12) The reactor vessels were left for cooling to room temperature and opened to collect solutions. The reaction mixtures were concentrated so that half of the solvent (MEK) is removed.

Example to prepare polymers with a nominal composition N1/P1/Q1 (50/35/15) at different molecular weights using CTA-HT3 as controlling agent in a library format (116964)

Stock Solutions are prepared in an inert atmosphere and are:

1) "Monomer Mixture": 16.506 g N1+15.466 g P1+5.846 g Q1+80 mL MEK

2) "MAIB Solution": 2.388 g MAIB+30 mL MEK to get 32.967 mL of stock solution.

3) "CTA Solution": 1.300 g CTA-H-T-3+3 mL MEK to get 4.615 mL of stock solution.

4) "MEK" (pure): 11.776 mL MEK

Reaction:

5) All of "CTA Solution" (ss-CTA-HT3) were preliminary added to 8 reactor vessels of a Semi-Continuous Parallel Pressurized Reactor (Table 5, ss-CTA-HT3).

6) Three individuals lines (2, 3 and 4) were respectively primed with solvent (MEK), ss-MAIB and the methacrylate stock solution (ss-methacrylate) before sealing the reactor vessels.

7) The reactor vessels were degassed by a pressurization, pressure relieve and backfilling under inert-cycles with high purity argon.

8) Solutions dispensed in each of the 8 reactor vessels are identified in table 5 (in microliters). All of the "MEK" (Line 2) was added to the reactor vessels, as well as 10% of ss-MAIB (Line 3) and "ss-methacrylate" (line 4).

9) The temperature was set at 80° C. and stirring was set at 400 rpm.

10) Once the reaction mixture reached 79° C., the semicontinuous addition of the remaining "Monomer Mixture" (line 4) and "MAIB Solution" (line 3) was begun, and added over the next six hours in a series of 100 equal volume injections while maintaining an internal temperature of 80° C.

11) Heating of the reaction mixture at 80° C. was continued until the end of the reaction.

12) The reactor vessels were left for cooling to room temperature and opened to collect solutions. The reaction mixtures were concentrated by removing half of the solvent (MEK). Physical results of isolated polymer are shown in Tables 5 and 6 for 116964.

Preparation of Sample B 15 (11695004) with a nominal composition N1/Q1/P6 (45/15/40) Targeting Mw=8,500 g/mol at 100% conversion using CTA-HAB1 as controlling agent in a library format Stock Solutions prepared for the whole library 116950 involving B15

1) Monomer Mixture "ss-B15": 3.82963 g N1+1.357287 g Q1+2.576706 g P6 in 30 mL MEK.

2) "MAIB Solution": 1.906579 g MAIB+45 mL MEK

3) "CTA Solution": 284.118 mg CTA-H-AB-1+2 mL MEK

4) "MEK" (pure): 55.559 mL MEK

For vial 11695004, volumes to be dispensed were:

1) "ss-B15": 6577.054 uL

2) "MAIB Solution": 433.4494 uL

3) "CTA-HAB1": 341.8227 uL

4) "MEK": 647.6735 uL

Reaction conditions:

1) CTA Solutions (341.8 uL of "CTA-HAB1" in vial 4) were preliminary added to reactor vessels of Symyx's Semi continuous Parallel Polymerization Reactor (SCPPR).

2) Lines of the reactor were respectively primed with solvent, MAIB and methacrylate solutions before sealing.

3) Vials are degassed by a pressurization, pressure relieve and backfilling under inert-cycles with high purity argon.

4) Solutions were dispensed for the synthesis of 11695004 as identified above. All of the "MEK" (647.6735 uL) was added to the reaction flask, as well as 10% of "MAIB Solution" (43.34 uL) and 10% of "Monomer Mixture" (657.70 uL).

5) The temperature was set at 80° C., stirring was set at 400 rpm and reactors pressurized at 120 psi.

6) Once the reaction mixture reached 79° C., the semi continuous addition of the remaining "Monomer Mixture" (line 4) and "MAIB Solution" (line 3) was begun, and added over the next six hours while maintaining an internal temperature of 80° C.

7) Heating of the reaction mixture at 80° C. was continued for an additional two hours past the end of the feed.

8) The reactors were left for cooling to room temperature and opened to collect solutions.

9) After precipitation into isopropanol, about 880 mg of polymer was collected (70% of yield after precipitation). Narrow calibration GPC gave Mw # 7,000 g/mol and PDI # 1.17. Conventional GPC gave Mw # 7,000 g/mol and PDI # 1.29.

Polymerization Processes (G) for Tables 1, 2, 3, 4, 5 and 6:

1: 10% of radical source (ss MAIB, V601, MAIB) and 10% of monomer loaded initially, 3 hours of feeding (100 injections) followed by 6 hours of reaction 2: 10% of radical source (ss-MAIB, V601) and 10% of monomer loaded initially 6 hours of feeding (100 injections) followed by 2 hours of reaction 3: 10% of radical source (ss-MAIB, V601) and 10% of monomer loaded initially followed by 5 hours of feeding (100 injections) only 4: 10% of radical source (ss-MAIB, V601) and 10% of monomer loaded initially followed by 12 hours of feeding (100 injections) only 5: 10% of radical source (ss-MAIB, V601) and 10% of monomer loaded initially 3 hours of feeding (100 injections) followed by 2 hours of reaction 6: polymers were dissolved in MEK (20% w/w) in the presence of 4 equivalents of radical source (AIBN, Lauroyl peroxide or MAIB) and heated at 85° C. for 1 h. Polymer is then purified by precipitation into isopropanol.

7: batch process polymerization for 3 h at 80C

8: feeding was performed over a period of 7 h followed by an additional hour of reaction.

9: batch process polymerization for 8 h at 80C

10: feeding was performed over a period of 8 h

11: 10% of radical source (ss-MAIB) and 10% of monomer loaded initially, 9 hours of feeding (100 injections) followed by 3 hours of reaction 12: 10% of radical source (ss-MAE3) and 10% of monomer loaded initially followed by a continuous feeding (100 injections) during 8 hours.

13: 10% of radical source (ss-MAIB) and 10% of monomer loaded initially, 15 hours of feeding (100 injections) followed by 5 hours of reaction 14: 10% of radical source (ss-MAIB) and 10% of monomer loaded initially, followed by a continuous feeding (100 injections) during 20 hours.

15: 10% of radical source (ss-MAIB) and 10% of monomer loaded initially, 3 hours of feeding (100 injections) followed by 1 hour of reaction

TABLE 1

| | | | | Polymerization Process Conditions | | | |
|---|---|---|---|---|---|---|---|
| Reference (A) | Sample # (B) | CTA (C) | MAIB/ CTA (D) | Cleavage (E) | Temperature (F) | Targeted Mw at 100% conversion | Process (G) | Targeted composition (H) |

| Reference (A) | Sample # (B) | CTA (C) | MAIB/CTA (D) | Cleavage (E) | Temperature (F) | Targeted Mw at 100% conversion | Process (G) | Targeted composition (H) |
|---|---|---|---|---|---|---|---|---|
| 11692711 | A4 | HT7 | 0.3 | — | 60 | 7000 | 1 | N2: 55 P5: 35 Q3: 10 |
| 11692712 | A5 | HT7 | — | lauroyl peroxide | 80 | 7000 | 6 | N2: 55 P5: 35 Q3: 10 |
| 11693911 | A1 | HT3 | 0.5 | — | 80 | 6000 | 2 | N1: 50 P1: 35 Q1: 15 |
| 11694211 | A2 | HT3 | — | lauroyl peroxide | 80 | 6000 | 6 | N1: 50 P1: 35 Q1: 15 |
| 11342201 | A2b | HT3 | — | MAIB | 65 | 6000 | 6 | N1: 50 P1: 35 Q1: 15 |
| 11342202 | A2c | HT3 | — | AIBN | 80 | 6000 | 6 | N1: 50 P1: 35 Q1: 15 |
| 11693316 | B4 | HAB1 | 0.3 | — | 80 | 12000 | 3 | N2: 55 P5: 35 Q3: 10 |
| 11692003 | B6 | HT7 | — | lauroyl peroxide | 65 | 20000 | 6 | N2: 55 P5: 35 Q3: 10 |
| 11693320 | B6b | HAB1 | 0.3 | — | 65 | 20000 | 1 | N2: 55 P5: 35 Q3: 10 |
| 11694001 | B1 | HT3 | 0.3 | — | 80 | 3000 | 4 | N1: 50 P1: 35 Q1: 15 |
| 11693012 | B3 | HT7 | — | lauroyl peroxide | 80 | 9000 | 6 | N1: 50 P1: 35 Q1: 15 |
| 11691323 | B3b | HT3 | 0.5 | — | 80 | 10000 | 2 | N1: 50 P1: 35 Q1: 15 |
| 11691305 | B3c | HT3 | 0.1 | — | 80 | 10000 | 5 | N1: 50 P1: 35 Q1: 15 |
| 11694501 | B7 | HT3 | 0.5 | — | 80 | 2400 | 2 | N1: 60 P1: 40 |
| 11694507 | B8 | HT3 | 0.5 | — | 80 | 6700 | 2 | N1: 60 P1: 40 |
| 11694515 | B9 | HT3 | 0.5 | — | 80 | 11000 | 2 | N1: 60 P1: 40 |
| 11695307 | B9b | HT3 | 0.5 | — | 80 | 13000 | 2 | N1: 60 P1: 40 |
| 11695308 | B9c | HT3 | 0.5 | — | 80 | 15000 | 2 | N1: 60 P1: 40 |
| 11695706 | B10 | HT3 | 0.5 | — | 80 | 12000 | 2 | N1: 60 P1: 40 |
| 11695010 | B11 | HT3 | 0.5 | — | 80 | 5500 | 2 | N1: 50 P2: 13 P1: 37 |
| 11695012 | B12 | HT3 | 0.5 | — | 80 | 8500 | 2 | N1: 50 P2: 13 P1: 37 |
| 11695701 | B12b | HT3 | 0.5 | — | 80 | 9000 | 2 | N1: 50 P2: 13 P1: 37 |
| 11695014 | B13 | HT3 | 0.5 | — | 80 | 5500 | 2 | N1: 60 P2: 10 P1: 30 |
| 40 | B14 | HT3 | 0.5 | — | 80 | 5000 | 2 | N1: 50 P2: 40 Q1: 10 |

TABLE 1-continued

Polymerization Process Conditions

| Reference (A) | Sample # (B) | CTA (C) | MAIB/CTA (D) | Cleavage (E) | Temperature (F) | Targeted Mw at 100% conversion | Process (G) | Targeted composition (H) |
|---|---|---|---|---|---|---|---|---|
| 11695004 | B15 | HAB1 | 0.4 | — | 80 | 7000 | 2 | N1: 50<br>P6: 40<br>Q1: 10 |
| 10639564 | | HT7 | 0.2 | — | 65 | 10000 | 7 | N2: 55<br>P5: 35<br>Q3: 10 |
| 11690741 | | HT7 | 0.2 | — | 65 | 10000 | 8 | N2: 55<br>P5: 35<br>Q3: 10 |
| 10639561 | | HT7 | 0.2 | — | 65 | 10000 | 7 | N1: 50<br>P1: 35<br>Q1: 15 |

TABLE 2

Physical Properties for Polymeric resins of Table 1

| | Conventional GPC | | Rapid calibration GPC | | $^1$H NMR |
|---|---|---|---|---|---|
| | Mw | PDI | Mw | PDI | composition |
| 11692711 | 6900 | 1.35 | 7000 | 1.30 | N2: 51<br>P5: 37<br>Q3: 12 |
| 11692712 | 7800 | 1.34 | 7500 | 1.25 | N2: 51<br>P5: 38<br>Q3: 11 |
| 11693911 | 6200 | 1.5 | 6300 | 1.32 | N1: 46<br>P1: nd<br>Q1: nd |
| 11694211 | 7400 | 1.29 | 7600 | 1.18 | N1: 46<br>P1: nd<br>Q1: nd |
| 11342201 | 6800 | 1.35 | 7404 | 1.23 | N1: 46<br>P1: nd<br>Q1: nd |
| 11342202 | 6500 | 1.36 | 7156 | 1.23 | N1: 46<br>P1: nd<br>Q1: nd |
| 11693316 | 4300 | 1.22 | 4500 | 1.16 | N2: 50<br>P5: 38<br>Q3: 12 |
| 11692003 | 12500 | 1.45 | 12400 | 1.28 | N2: 49<br>P5: 38<br>Q3: 13 |
| 11693320 | 10500 | 1.53 | 11000 | 1.24 | N2: 49<br>P5: 38<br>Q3: 13 |
| 11694001 | 3500 | 1.25 | 3600 | 1.31 | N1: 50<br>P1: nd<br>Q1: nd |
| 11693012 | 8700 | 1.4 | 8700 | 1.22 | N1: 48<br>P1: nd<br>Q1: nd |
| 11691323 | 7800 | 1.4 | 7800 | 1.28 | N1: 47<br>P1: nd<br>Q1: nd |
| 11691305 | 10300 | 1.51 | 10500 | 1.27 | N1: 46<br>P1: nd<br>Q1: nd |
| 11694501 | 3100 | 1.3 | 3500 | 1.27 | N1: 58<br>P1: 42 |
| 11694507 | 6500 | 1.57 | 6300 | 1.31 | N1: 59<br>P1: 41 |
| 11694515 | 9100 | 1.67 | 9100 | 1.39 | N1: 59<br>P1: 41 |
| 11695307 | 8900 | 1.35 | 9000 | 1.31 | N1: 58<br>P1: 42 |
| 11695308 | 10100 | 1.44 | 10000 | 1.28 | N1: 59<br>P1: 41 |
| 11695703 | 11700 | 1.75 | 12300 | 1.39 | N1: 59<br>P1: 41 |
| 11695010 | 5000 | 1.4 | 5500 | 1.19 | N1: nd<br>P2: nd<br>P1: nd |
| 11695012 | 7200 | 1.47 | 7200 | 1.29 | N1: nd<br>P2: nd<br>P1: nd |
| 11695701 | 8800 | 1.6 | 9000 | 1.31 | N1: nd<br>P2: nd<br>P1: nd |
| 11695014 | 5300 | 1.45 | 5500 | 1.28 | N1: nd<br>P2: nd<br>P1: nd |
| 11695015 | 4500 | 1.39 | 5300 | 1.25 | N1: nd<br>P2: nd<br>Q1: nd |
| 11695004 | 7000 | 1.29 | 7000 | 1.17 | N1: 43<br>P6: nd<br>Q1: nd |
| 11692005 | nd | nd | 8100 | 1.14 | N1: 46<br>P1: nd<br>Q1: nd |
| 11691705 | 6500 | 1.26 | 7100 | 1.14 | N2: 49<br>P5: 38<br>Q3: 13 |
| 10639564 | nd | nd | 3500 | 1.27 | N2: 59<br>P5: 32<br>Q3: 9 |
| 11690741 | nd | nd | 4600 | 1.13 | N2: 52<br>P5: 36<br>Q3: 13 |
| 10699561 | nd | nd | 36000 | 1.6 | N1: nd<br>P1: nd<br>Q1: nd | nd = not determined

Size Exclusion Chromatography was performed using an automated rapid GPC system for rapid screening (see WO 99/51980, incorporated herein by reference). An automated conventional GPC system was utilized for secondary screening. In the current setup N,N-dimethylformamide containing 0.1% of trifluoroacetic acid was used as an eluent for the rapid GPC system whereas THF was used for the conventional system and polystyrene-based columns. All of the molecular weight results obtained are relative to linear polystyrene standards. NMR was carried out using a Bruker spectrometer (300 MHz) with $CDCl_3$ (chloroform-d) as solvent.

Rapid calibration GPC utilized 3 columns (PLgel, 5 µm Mixed D 300×7.5 mm) THF 1.0 mL/min; detectors RI, UV 220 and 290 nm; Standard for calibration: EsiCal PS-2

Conventional calibration GPC utilized 3 columns (PLgel, 10 µm Mixed-B 300×7.5 mm) THF 1.0 mL/min; detectors RI, UV 280 nm; Standard for calibration: EsiCal PS-1

TABLE 3

Volume of stock solutions (ss) in microliters, dispensed in an array format: Preparation of Polymeric Resins via Semi-continuous parallel polymerization reactions (SCPPR)

| Vial | 2-butanone Line 2 | ss-MAIB Line 3 | ss-methacrylate Line 4 | ss-CTA-HT3 |
|---|---|---|---|---|
| 1 | 88.36388 | 1364.563 | 6171.411 | 375.6622 |
| 2 | 958.4765 | 682.2815 | 6171.411 | 187.8311 |
| 3 | 1248.514 | 454.8543 | 6171.411 | 125.2207 |
| 4 | 1426.999 | 314.8991 | 6171.411 | 86.69128 |
| 5 | 88.36388 | 1364.563 | 6171.411 | 375.6622 |
| 6 | 958.4765 | 682.2815 | 6171.411 | 187.8311 |
| 7 | 1248.514 | 454.8543 | 6171.411 | 125.2207 |
| 8 | 1426.999 | 314.8991 | 6171.411 | 86.69128 |
| 9 | 88.36388 | 1364.563 | 6171.411 | 375.6622 |
| 10 | 958.4765 | 682.2815 | 6171.411 | 187.8311 |
| 11 | 1248.514 | 454.8543 | 6171.411 | 125.2207 |
| 12 | 1426.999 | 314.8991 | 6171.411 | 86.69128 |
| 13 | 88.36388 | 1364.563 | 6171.411 | 375.6622 |
| 14 | 958.4765 | 682.2815 | 6171.411 | 187.8311 |
| 15 | 1248.514 | 454.8543 | 6171.411 | 125.2207 |
| 16 | 1426.999 | 314.8991 | 6171.411 | 86.69128 |
| 17 | 88.36388 | 1364.563 | 6171.411 | 375.6622 |
| 18 | 958.4765 | 682.2815 | 6171.411 | 187.8311 |
| 19 | 1248.514 | 454.8543 | 6171.411 | 125.2207 |
| 20 | 1426.999 | 314.8991 | 6171.411 | 86.69128 |
| 21 | 88.36388 | 1364.563 | 6171.411 | 375.6622 |
| 22 | 958.4765 | 682.2815 | 6171.411 | 187.8311 |
| 23 | 1248.514 | 454.8543 | 6171.411 | 125.2207 |
| 24 | 1426.999 | 314.8991 | 6171.411 | 86.69128 |

TABLE 4 polymerization results with library 116959 at 80° C. Polymerizations were all performed at 80° C., initial molar ratio MAIB/CTA = 0.5, CTA-H-T-3 as a controlling agent with a targeted composition in molar percent of 50% N1, 35% P1 and 15% Q1. 11698401 and 11698402 were performed in schlenk tubes as a batch process. Conversion was estimated by Raman Spectroscopy (measuring the disappearance of vibration peak at 1600 $cm^{-1}$) and by $^1H$ NMR for 11698401 and 11698402 (% of NML).

| Reference (A) | Process (G) | Mw targeted | Conversion (%) | Mw | PDi |
|---|---|---|---|---|---|
| 11698401 | 9 | 3,000 | 90* | 4400 | 1.62 |
| 11698402 | 9 | 9,000 | 85* | 8800 | 1.57 |
| 11695901 | 2 | 3,000 | 86 | 3800 | 1.34 |
| 11695902 | 2 | 6,000 | 85 | 6000 | 1.35 |
| 11695903 | 2 | 9,000 | 81 | 7800 | 1.33 |
| 11695904 | 2 | 12,000 | 70 | 10500 | 1.3 |
| 11695905 | 10 | 3,000 | 92 | 3600 | 1.36 |
| 11695906 | 10 | 6,000 | 85 | 5700 | 1.32 |
| 11695907 | 10 | 9,000 | 75 | 7100 | 1.34 |
| 11695908 | 10 | 12,000 | 82 | 9700 | 1.27 |
| 11695909 | 11 | 3,000 | 94 | 3900 | 1.59 |
| 11695910 | * | | | | |
| 11695911 | * | | | | |

TABLE 4-continued polymerization results with library 116959 at 80° C. Polymerizations were all performed at 80° C., initial molar ratio MAIB/CTA = 0.5, CTA-H-T-3 as a controlling agent with a targeted composition in molar percent of 50% N1, 35% P1 and 15% Q1. 11698401 and 11698402 were performed in schlenk tubes as a batch process. Conversion was estimated by Raman Spectroscopy (measuring the disappearance of vibration peak at 1600 $cm^{-1}$) and by $^1H$ NMR for 11698401 and 11698402 (% of NML).

| Reference (A) | Process (G) | Mw targeted | Conversion (%) | Mw | PDi |
|---|---|---|---|---|---|
| 11695912 | * | | | | |
| 11695913 | 4 | 3,000 | 90 | 4670 | 1.61 |
| 11695914 | * | | | | |
| 11695915 | * | | | | |
| 11695916 | 4 | 12,000 | 43 | 10720 | 1.41 |
| 11695917 | 13 | 3,000 | 97 | 3500 | 1.33 |
| 11695918 | 13 | 6,000 | 97 | 6100 | 1.35 |
| 11695919 | 13 | 9,000 | 97 | 8000 | 1.39 |
| 11695920 | 13 | 12,000 | 92 | 10800 | 1.38 |
| 11695921 | 14 | 3,000 | 95 | 4300 | 1.4 |
| 11695922 | 14 | 6,000 | 93 | 5700 | 1.35 |
| 11695923 | 14 | 9,000 | 83 | 7200 | 1.36 |
| 11695924 | * | | | | |

*Mechanical failure, no result
11698401 and 11698402 were prepared in a batch process

TABLE 5

Volume of the stock solutions (in uL dispensed in an array format using SCPPR.

| Vial | Strip | MEK Line 2 | ss-MAIB Line 3 | ss-methacrylate Line 4 | ss-CTA-HT3 |
|---|---|---|---|---|---|
| 1 | | 6.904158 | 1023.422 | 6486.679 | 482.9943 |
| 2 | 1 | 760.1124 | 511.7111 | 6486.679 | 241.4971 |
| 3 | | 1011.182 | 341.1407 | 6486.679 | 160.9981 |
| 4 | | 1165.686 | 236.1744 | 6486.679 | 111.4602 |
| 17 | | 6.904158 | 1023.422 | 6486.679 | 482.9943 |
| 18 | 3 | 760.1124 | 511.7111 | 6486.679 | 241.4971 |
| 19 | | 1011.182 | 341.1407 | 6486.679 | 160.9981 |
| 20 | | 1165.686 | 236.1744 | 6486.679 | 111.4602 |

TABLE 6 polymerization results with library 116964 AT 80° C. Polymerization were all performed at 80° C., initial molar ratio MAIB/CTA = 0.5, CTA-H-T-3 as a controlling agent with targeted composition in molar percent of 50% N1, 35% P1 and 15% Q1. Conversion was estimated by Raman Spectroscopy (measuring the disappearance of vibration peak at 1600 $cm^{-1}$).

| Symyx Reference (A) | Process (G) | Mw targeted | Conversion (%) | Mw | PDi |
|---|---|---|---|---|---|
| 11695901 | 15 | 3,000 | 86 | 3800 | 1.33 |
| 11695902 | 15 | 6,000 | 87 | 6100 | 1.35 |
| 11695903 | 15 | 9,000 | 85 | 8400 | 1.37 |
| 11695904 | 15 | 13,000 | 80 | 10500 | 1.37 |
| 11695917 | 2 | 3,000 | 97 | 3740 | 1.29 |
| 11695918 | 2 | 6,000 | 97 | 6200 | 1.30 |
| 11695919 | 2 | 9,000 | 97 | 8200 | 1.31 |
| 11695920 | 2 | 13,000 | 95 | 11200 | 1.33 |

For more information regarding general synthesis utilizing a semicontinuous polymerization reactor (SCPPR), see for example, U.S. patent application Ser. No. 09/873,176, filed on Jun. 1, 2001 entitled "Parallel Semicontinuous or Continuous Reactors", the contents of which are incorporated herein by reference in their entirety.

Although the present invention has been described with reference to preferred embodiments, persons skilled in the art will recognize that changes may be made in form and detail without departing from the spirit and scope of the invention.

We claim:

1. A method of free radical polymerization to form a polymer comprising the formula:

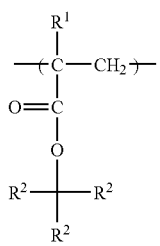

(1)

wherein $R^1$ represents a hydrogen atom or a methyl group, each $R^2$, individually, represents a linear or branched, non-substituted or substituted, alkyl group having 1-4 carbon atoms or a bridged or non-bridged, non-substituted or substituted, monovalent alicyclic hydrocarbon group having 4-20 carbon atoms, provided that at least one $R^2$ group is a linear or branched alkyl group having 1-4 carbon atoms, or any two $R^2$ groups form, in combination and together with the carbon atoms to which the two $R^2$ groups bond, a bridged or non-bridged, non-substituted or substituted, divalent alicyclic hydrocarbon group having 4-20 carbon atoms, with the remaining $R^2$ groups being a linear or branched, non-substituted or substituted, alkyl group having 1-4 carbon atoms or —$C(R_2)_3$, is one of

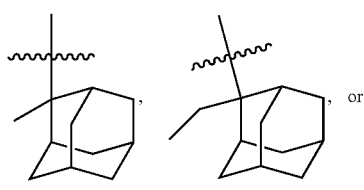

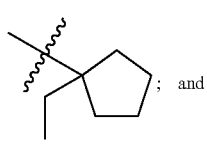

wherein the polymer is prepared by a living free radical process (LFRP) in the presence of a chain transfer agent (CTA) having the formula

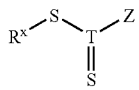

wherein $R^x$ is a group that is sufficiently labile to be expelled as its free radical form, T is carbon or phosphorus, and Z is any group that activates the C=S double bond towards a reversible free radical addition fragmentation reaction.

2. The method of claim 1, wherein Z is selected from the group consisting of hydrocarbyl, substituted hydrocarbyl, heteroatom-containing hydrocarbyl, substituted heteroatom-containing hydrocarbyl, and combinations thereof.

3. The method of claim 1, wherein Z is selected from the group consisting of hydrogen, optionally substituted alkyl, optionally substituted aryl, optionally substituted alkenyl, optionally substituted acyl, optionally substituted, aroyl, optionally substituted alkoxy, optionally substituted heteroaryl, optionally substituted heterocyclyl, optionally substituted alkylsulfonyl, optionally substituted alkylsulfinyl, optionally substituted alkylphosphonyl, optionally substituted arylsulfinyl, and optionally substituted arylphosphonyl.

4. The method of claim 1, wherein the —$C(R_2)_3$ structure in the recurring unit (1) is a 2-methyl-2-tricyclodecanyl group, 2-ethyl-2-tricyclodecanyl group, 2-methyl-2-adamantyl group, 2-ethyl-2-adamantyl group, 1-methylcyclopentyl group, 1-ethylcyclopentyl group, 1-methylcyclohexyl group, or 1-ethylcyclohexyl group.

5. The method of any of claims 1-4, wherein the polymerization process further comprises addition of a monomer that results in at least a second recurring unit selected from

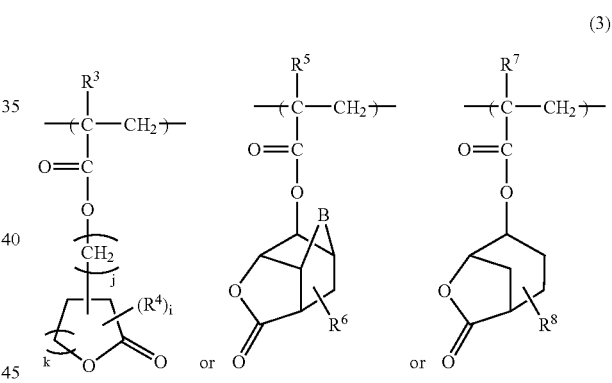

(3)

wherein $R^3$ represents a hydrogen atom or a methyl group, $R^4$ is a linear or branched alkyl group having 1-6 carbon atoms or a linear or branched alkyl group having 1-6 carbon atoms substituted with one or more alkyloxy, alkylcarbonyloxy or oxo groups, two or more $R^4$ groups, if present, being either the same or different, i is an integer of 0–(3+k), j is 0 or 1, k is an integer of 1-3, $R^5$ represents a hydrogen atom or a methyl group, B is a methylene group, an oxygen atom, or a sulfur atom, $R^6$ represents a hydrogen atom, a linear or branched alkyl group having 1-6 carbon atoms, or a linear or branched alkyl group having 1-6 carbon atoms substituted with one or more alkyloxy, alkylcarbonyloxy or oxo groups, $R^7$ represents a hydrogen atom or a methyl group, and $R^8$ represents a hydrogen atom, a linear or branched alkyl group having 1-6 carbon atoms, or a linear or branched alkyl group having 1-6 carbon atoms substituted with one or more alkyloxy, alkylcarbonyloxy or oxo groups.

6. The method of claim 5, wherein the polymerization process further comprises addition of a monomer that results in a recurring having the formula:

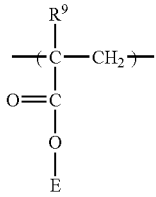
(4)

wherein where E represents a group derived from non-bridged or bridged, non-substituted or substituted alicyclic hydrocarbons and $R^9$ is a hydrogen atom, trifluoromethyl or a methyl group.

7. The method of claim 1, wherein the Mw is between about 2,000 and 30,000.

8. The method of claim 2, wherein the Mw is between about 2,000 and 30,000.

9. The method of claim 3, wherein the Mw is between about 2,000 and 30,000.

10. The method of claim 4, wherein the Mw is between about 2,000 and 30,000.

11. The method of claim 5, wherein the Mw is between about 2,000 and 30,000.

12. The method of claim 6, wherein the Mw is between about 2,000 and 30,000.

13. The method of claim 1, wherein the polydispersity is less than or equal to about 1.5.

14. The method of claim 2, wherein the polydispersity is less than or equal to about 1.5.

15. The method of claim 3, wherein the polydispersity is less than or equal to about 1.5.

16. The method of claim 4, wherein the polydispersity is less than or equal to about 1.5.

17. The method of claim 5, wherein the polydispersity is less than or equal to about 1.5.

18. The method of claim 6, wherein the polydispersity is less than or equal to about 1.5.

19. The method of claim 1, wherein a terminal end group of the polymer with a CTA fragment is treated such that the CTA fragment is cleaved.

20. The method of claim 2, wherein a terminal end group of the polymer with a CTA fragment is treated such that the CTA fragment is cleaved.

21. The method of claim 3, wherein a terminal end group of the polymer with a CTA fragment is treated such that the CTA fragment is cleaved.

22. The method of claim 4, wherein a terminal end group of the polymer with a CTA fragment is treated such that the CTA fragment is cleaved.

23. The method of claim 5, wherein a terminal end group of the polymer with a CTA fragment is treated such that the CTA fragment is cleaved.

24. The method of claim 6, wherein a terminal end group of the polymer with a CTA fragment is treated such that the CTA fragment is cleaved.

* * * * *